United States Patent [19]

Hillis et al.

[11] Patent Number: 5,118,975

[45] Date of Patent: Jun. 2, 1992

[54] DIGITAL CLOCK BUFFER CIRCUIT PROVIDING CONTROLLABLE DELAY

[75] Inventors: W. Daniel Hillis, Brookline; Zahi S. Abuhamdeh, Boston; Bradley C. Kuszmaul, Waltham; Shaw-Wen Yang, Waltham; Jon P. Wade, Cambridge, all of Mass.

[73] Assignee: Thinking Machines Corporation, Cambridge, Mass.

[21] Appl. No.: 489,079

[22] Filed: Mar. 5, 1990

[51] Int. Cl.⁵ .................. H03K 5/159; H03K 5/13
[52] U.S. Cl. ............................. 307/602; 307/603; 307/606; 307/595; 307/597; 328/55; 328/66; 328/155
[58] Field of Search ............ 307/595, 597, 602, 603, 307/606, 262, 269; 328/55, 66, 155

[56] References Cited

U.S. PATENT DOCUMENTS

| | | | |
|---|---|---|---|
| 4,339,823 | 7/1982 | Predina et al. | 375/20 |
| 4,355,387 | 10/1982 | Portejoie et al. | 370/102 |
| 4,365,210 | 12/1982 | Harrington et al. | 331/1 A |
| 4,369,515 | 1/1983 | Valdes | 375/108 |
| 4,390,801 | 6/1983 | Kurata et al. | 307/409 |
| 4,412,342 | 10/1983 | Khan et al. | 375/107 |
| 4,475,085 | 10/1984 | Yahata et al. | 328/62 |
| 4,479,216 | 10/1984 | Krambeck et al. | 371/61 |
| 4,504,749 | 3/1985 | Yoshida | 307/602 |
| 4,516,035 | 5/1985 | Rhoads et al. | 307/66 |
| 4,519,086 | 5/1985 | Hull et al. | 375/120 |
| 4,573,173 | 2/1986 | Yoshida | 375/118 |
| 4,580,278 | 4/1986 | Yamamoto | 375/106 |
| 4,590,602 | 5/1986 | Wolaver | 375/120 |
| 4,617,679 | 10/1986 | Brooks | 375/119 |
| 4,626,798 | 12/1986 | Fried | 331/1 A |
| 4,633,488 | 12/1986 | Shaw | 375/120 |
| 4,635,000 | 1/1987 | Swanberg | 331/10 |
| 4,637,018 | 1/1987 | Flora et al. | 371/1 |
| 4,651,026 | 3/1987 | Serfaty et al. | 307/269 |
| 4,663,523 | 5/1987 | Swanberg | 250/235 |
| 4,680,779 | 7/1987 | Wakerly | 375/107 |
| 4,689,575 | 8/1987 | Ott | 328/63 |
| 4,692,932 | 9/1987 | Denhsz et al. | 375/107 |
| 4,700,347 | 10/1987 | Rettberg et al. | 371/1 |
| 4,744,096 | 5/1988 | Roun | 375/120 |
| 4,759,041 | 7/1988 | Anderson et al. | 375/118 |
| 4,771,196 | 9/1988 | Mead et al. | 307/605 |
| 4,779,008 | 10/1988 | Kessels | 307/269 |
| 4,804,928 | 2/1989 | Chloupek et al. | 331/1 A |
| 4,807,266 | 2/1989 | Taylor | 377/48 |
| 4,829,377 | 5/1989 | Becker et al. | 358/147 |
| 4,873,491 | 10/1989 | Wilkins | 307/262 |
| 4,908,841 | 3/1990 | Leis et al. | 375/81 |

OTHER PUBLICATIONS

Horowitz et al., "The Art of Electronics", 2d Ed., (Cambridge Univ. Press, 1989, pp. 512-515, 533 and 1121.

R. D. Rettberg et al., The Monarch Parallel Processor Hardware Design, IEEE Computer, Apr., 1990 pp. 18-30.

M. G. Gallup et al., Testability Features of 68040, Proceedings of the 1990 International Test Conference, Sep. 10-14, 1990 (IEEE Computer Society Press, 1990), pp. 749-757.

R. Rettberg et al., IEEE Computer, vol. 23, No. 4, (Apr. 1990) pp. 18-30.

M. Johnson et al., "A Variable Delay Line PLL for CPU-Coprocessor Synchronization," IEEE J. Solid-State Circuits, vol. 23, No. 5 (Oct. 1988) pp. 1218-1223.

P. Bassett et al., "Dynamic Delay Adjustment: A Technique for High-Speed Asynchronous Communication," in ADVANCED RESEARCH IN VLSI, Proc. Fourth MIT Conf. Apr. 7-9, 1986 (C. Leiserson, ed., MIT Press: 1986) pp. 219-232.

*Primary Examiner*—Stanley D. Miller
*Assistant Examiner*—Trong Phan
*Attorney, Agent, or Firm*—Richard A. Jordan

[57] ABSTRACT

A clock buffer circuit that generates a local clock signal in response to a system clock signal. The clock buffer circuit includes a buffer circuit for generating the local clock signal in response to an intermediate clock signal. A buffer control circuit generates the intermediate clock signal in response to the system clock signal and the local clock signal. The buffer control circuit provides a variable delay so that, with an additional delay provided by the buffer circuit, the local clock signal has a selected phase relationship in relation to the system clock signal.

35 Claims, 9 Drawing Sheets

CLOCK BUFFER
CIRCUIT 10

CLOCK BUFFER CIRCUIT 10

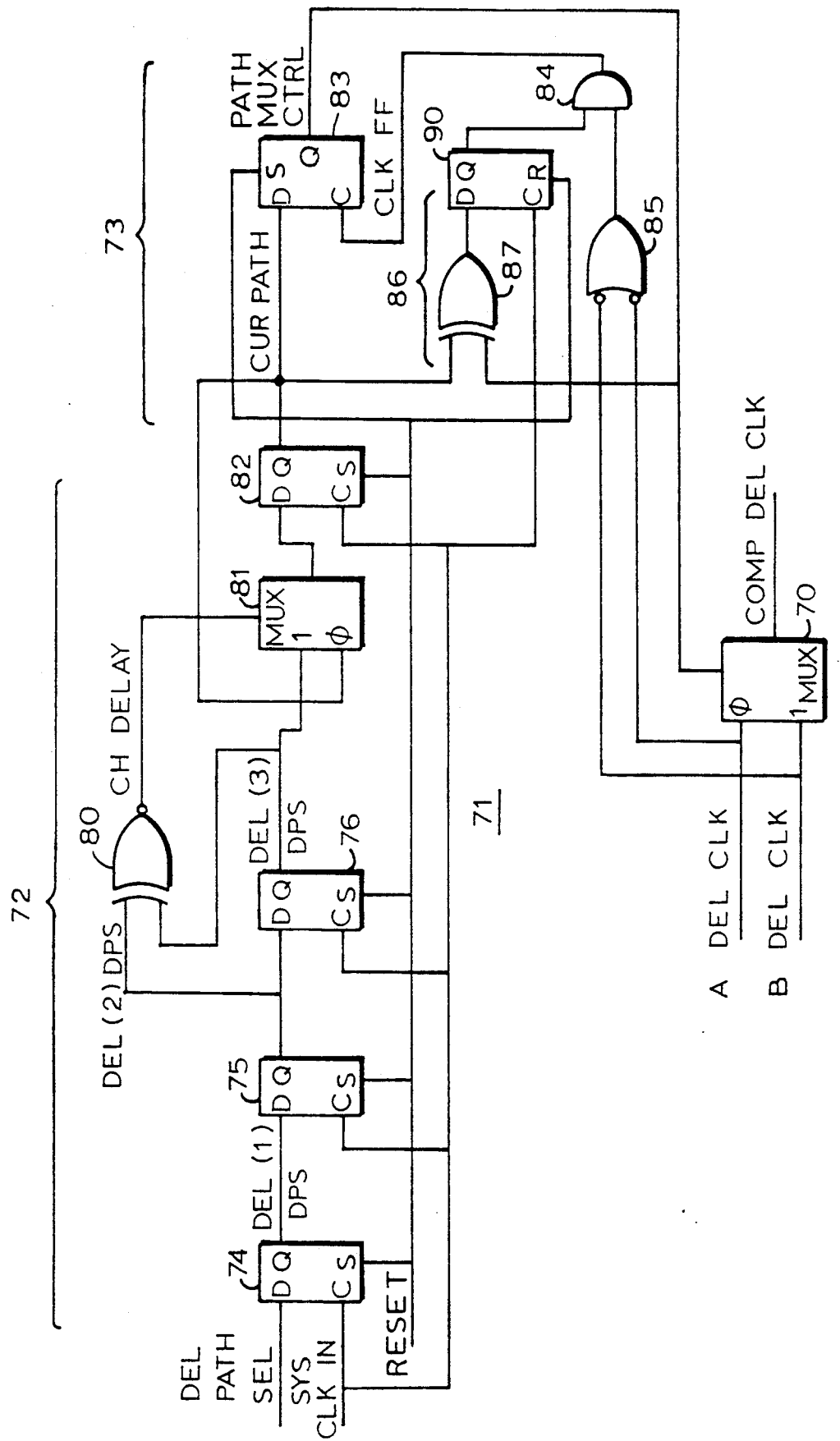

DIGITAL CLOCK BUFFER CIRCUIT PROVIDING CONTROLLABLE DELAY

FIELD OF THE INVENTION

The invention relates generally to the field of digital circuitry, and more specifically to clock buffer control circuits for controlling relative timing of sequential ticks of a clock signal used to control the digital circuitry.

BACKGROUND OF THE INVENTION

Digital systems normally operate in synchronism with sequential ticks of one or more clock signals. The ticks of a clock signal, which are defined by voltage transitions representing its leading or trailing edges, control processing circuitry that decodes, processes and stores data signals in response to control signals, in a sequence of processing cycles. The rate at which a digital system can process data is determined, in part, by the maximum amount of time required for the data and control signals to propagate through the processing circuitry in one processing cycle.

Typical digital circuitry is comprised of a number of integrated circuit chips which contain much of the processing circuitry. Many of the chips have one or more clock terminals, each terminal receiving a clock signal that controls the circuitry on the chip. Typically, a clock terminal on a chip is connected to a clock buffer circuit that drives a network of lines on the chip used to distribute the clock signal to the processing circuitry thereon.

As a result of various delays inherent in propagating a clock signal through a clock buffer circuit, the edges of the clock signal are delayed, such that the edges of the clock signal at the output of the clock buffer circuit do not occur in precise synchronism with the edges of the clock signal at the clock terminal. While this might not be a major problem if the propagation delay were uniform in all of the chips that are used in a system, in fact the propagation delay from chip to chip may vary unpredictably by a substantial amount as a result of variations in manufacturing from chip to chip. To accommodate such unpredictable variations, the clock period has to be further increased (otherwise stated, the time between edges has to be further increased), which reduces the rate at which processing can be accomplished by the system. Alternately, chips can be tested and selected for use in a system if they meet selected criteria in the uniformity of the propagation delay exhibited thereby, but that would result in a likely increase in the cost of the system.

SUMMARY OF THE INVENTION

The invention provides a new and improved clock buffer circuit for use in connection with, for example, an integrated circuit chip, that controls the timing of ticks in the clock signal as transmitted thereby in relation to the transitions in a system clocking signal received thereby.

In brief summary, the clock buffer circuit generates a local clock signal in response to a system clock signal. The clock buffer circuit includes a buffer circuit for generating said local clock signal in response to an intermediate clock signal. A buffer control circuit generates the intermediate clock signal in response to said system clock signal and the local clock signal. The buffer control circuit provides a variable delay so that, with an additional delay provided by the buffer circuit, the local clock signal has a selected phase relationship in relation to the system clock signal.

The clock buffer circuit controls the relative phases of the local clock signal in relation to the system clock signal. If the circuit is implemented on an integrated circuit chip, for example, it can obviate problems that may result from timing differences among chips which may result from tolerances and variations in manufacturing processes. This can reduce manufacturing costs that might normally be imposed by tight manufacturing tolerances or that might be required to screen chips after manufacture. Alternately, the clock buffer circuit can enable a corresponding increase in processing by the processing circuitry on the chip, since variations in the timings of the local clock signal among the various chips comprising a system can be controlled or reduced.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 4 is a logic diagram of a clock delay select circuit useful in the voltage controlled delay element depicted in FIG. 2;

DETAILED DESCRIPTION OF AN ILLUSTRATIVE EMBODIMENT

Figure 1:
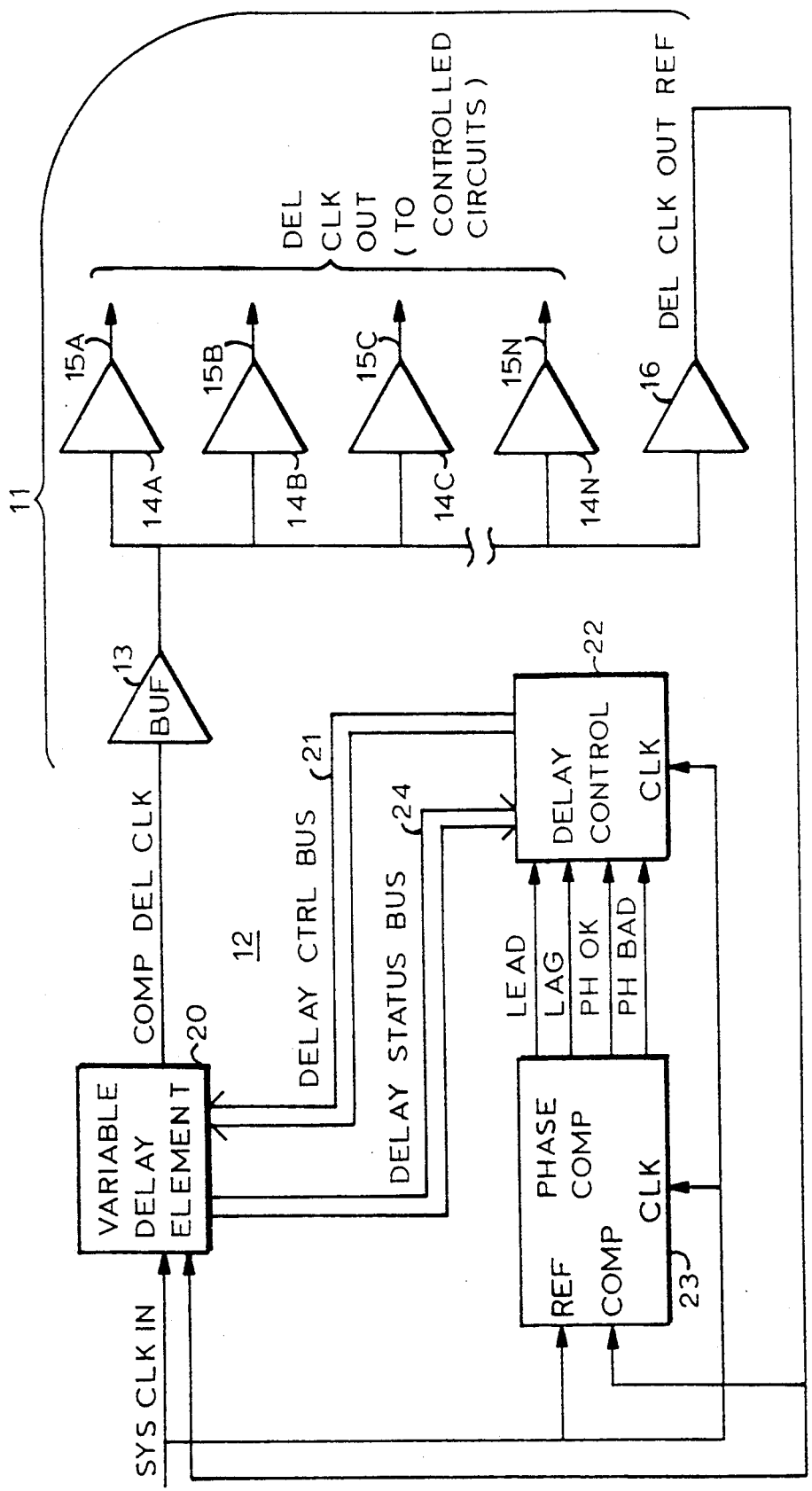
FIG. 1 depicts a functional block diagram of a clock buffer circuit constructed in accordance with the invention.

FIG. 1 depicts a functional block diagram of a clock buffer circuit 10 constructed in accordance with the invention. With reference to FIG. 1, the clock buffer circuit 10 includes a buffer 11 and a buffer control circuit 12, all of which may be located on a single integrated circuit chip. The clock buffer circuit 10 receives a periodic SYS CLK IN system clock in signal, which may be generated by a clock circuit (not shown) which may be external to the chip containing clock buffer circuit 10, and in response thereto generates one or more DEL CLK OUT delayed clock out signals which are transmitted to other circuitry on the chip (not shown). As is conventional, the SYS CLK IN system clock in signal has a substantially constant period, that is, the time periods between the transitions defining successive leading edges of the signal are substantially uniform, and the time periods between the transitions defining successive trailing edges of the signal are also substantially uniform. The time periods between successive edges of the SYS CLK IN system clock in signal may also be substantially uniform, in which case the signal is said to have a "fifty-percent duty cycle."

The clock buffer circuit 10 generates the DEL CLK OUT delayed clock out signals to have substantially the same timing characteristics as the SYS CLK IN system clock in signal. That is, the clock buffer circuit 10 generates the DEL CLK OUT delayed clock out signals to have substantially the same periods between successive leading edges and successive trailing edges as the SYS CLK IN system clock in signal. In addition the clock buffer circuit generates the DEL CLK OUT delayed clock out signals to have the same timing relationships between successive edges as the SYS CLK IN system clock in signal, with the result that all of the signals have the same duty cycle.

In accordance with the invention, the clock buffer circuit 10 also generates the DEL CLK OUT delayed clock out signals so that their transitions have a predetermined and controllable timing relationship with the corresponding transitions of the SYS CLK IN system clock in signal. That is, (1) the transitions of the DEL CLK OUT signals defining their leading edges all lead or lag the transitions defining the leading edges of the SYS CLK IN system clock in signal by a uniform, predetermined, and controllable amount, and (2) the transitions defining the trailing edges of the DEL CLK OUT delayed clock out signal have the same relationship with the transitions defining the trailing edge of the SYS CLK IN system clock in signal. In one particular embodiment, described in connection with FIGS. 1 through 5, the clock buffer circuit generates the DEL CLK OUT delayed clock out signals so that their leading edges occur at substantially the same time as the leading edges of the SYS CLK IN system clock in signal and their trailing edges also occur at substantially the same time as the trailing edges of the SYS CLK IN system clock in signal. In that embodiment, since the SYS CLK IN system clock in signal has a substantially uniform periodicity, the clock buffer circuit 10 essentially provides DEL CLK OUT delayed clock out signals with an effective zero delay from the SYS CLK IN system clock in signal.

With this background, the clock buffer circuit 10 will be described in greater detail. The buffer 11 includes a buffer amplifier 13 which receives a COMP DEL CLK composite delayed clock signal generated by the buffer control circuit 12, and, in turn, drives one or more drivers 14A through 14N (generally identified by reference numeral 13. The drivers 14A through 14N generate one or more DEL CLK OUT delayed clock out signals that are transmitted over lines 15A through 15N (generally identified by reference numeral 14), representing a clock network, to control operations of processing circuits (not shown). Typically, the drivers 14A through 14N on a chip will have substantially the same operational characteristics, so that transitions in the DEL CLK OUT delayed clock out signals generated by the various drivers 14A through 14N occur substantially simultaneously.

In addition, the buffer amplifier 13 drives another driver 16 which generates a DEL CLK OUT REF delayed clock out reference signal, which will be used as described below. The driver 16 also has the substantially same operational characteristics as the drivers 14. As a result, the DEL CLK OUT delayed clock out signals from drivers 14 have substantially the same timing characteristics as the DEL CLK OUT REF delayed clock out reference signal generated by driver 16. In particular, the transitions of the DEL CLK OUT REF delayed clock out reference signal occur substantially simultaneously with the transitions of the DEL CLK OUT delayed clock out signals generated by drivers 14.

The buffer control circuit 12 receives the SYS CLK IN system clock in signal and generates the COMP DEL CLK composite delayed clock signal in response to both the SYS CLK IN system clock in signal and the DEL CLK OUT REF delayed clock out reference signal from driver 16. The buffer control circuit 12 generates the COMP DEL CLK composite delayed clock signal so as to have transitions that occur at times so that the transitions of the DEL CLK OUT REF delayed clock out reference signal, and thus the transitions of the DEL CLK OUT delayed clock out signals, occur at substantially the same time as transitions of the SYS CLK IN system clock in signal, thereby providing the effective zero delay through the clock buffer 10. Otherwise stated, the buffer control circuit 12 provides a delay that, with the additional delay provided by the buffer 11, results in DEL CLK OUT delayed clock out signals that have an effective zero delay in relation to the SYS CLK IN system clock in signal.

The buffer control circuit 12 includes a variable delay element 20 that receives the SYS CLK IN system clock in signal, and generates the COMP DEL CLK composite delayed clock signal with a delay that is controllable in response to delay control signals which it receives over a delay control bus 21 from a delay control circuit 22. A phase comparator 23 receives the SYS CLK IN system clock in signal and the DEL CLK OUT REF delayed clock out reference signal from driver 16 and generates, in response thereto, a LEAD signal, a LAG signal, a PH OK in-phase signal, and a PH BAD out-of-phase signal, which the delay control circuit 22 use in controlling the variable delay element 20. Status signals generated by the variable delay element 20, transmitted over a delay status bus 24, also are used by the delay control circuit 22 in controlling the variable delay element 20.

The signals generated by the phase comparator 23 indicate selected timing relationships between the SYS CLK IN system clock in signal and the DEL CLK OUT REF delayed clock out reference signal. The LEAD signal, when asserted, indicates that the edges of the SYS CLK IN system clock in signal lead corresponding edges of the DEL CLK OUT REF delayed clock out reference signal. The LAG signal, when asserted, indicates that the edges of the SYS CLK IN system clock in signal lag corresponding edges of the DEL CLK OUT REF delayed clock out reference signal. The PH OK in-phase signal, when asserted, indicates that the edges of the SYS CLK IN system clock in signal occur substantially simultaneously with corresponding edges of the DEL CLK OUT REF delayed clock out reference signal, in which case the signals are in phase. Finally, the PH OUT out-of-phase signal, when asserted, indicates that the edges of the SYS CLK IN system clock in signal occur substantially simultaneously with opposite edges of the DEL CLK OUT REF delayed clock out reference signal, that is, the SYS CLK IN system clock in signal and the DEL CLK OUT REF delayed clock out reference signal are approximately one hundred and eighty degrees out of phase.

The variable delay element 20 and delay control circuit 22 will be described in greater detail in connection with FIG. 2. Preliminarily, the variable delay element 20 includes two delay paths identified here as A delay path 25A and B delay path 25B (generally identified by reference numeral 25). Each delay path 25 provides an amount of delay, which can be incrementally varied independent of the other path by the delay control circuit 22. The delay control circuit 22 alternately switches between the A and B delay paths 25A and 25B as it varies the delay provided by the variable delay element 20.

The structure and operation of the A and B delay paths 25 are substantially similar, and so only A delay path 25A will be described in detail. With reference to FIG. 2, the A delay path 25A includes a shared delay line 30, which is shared between the two delay path 25 and an A delay line 26A. The shared delay line receives the SYS CLK IN system clock in signal and the A delay line 26A generates an A DEL CLK delayed clock signal which is delayed from the SYS CLK IN system clock in signal by an amount determined by a binary counter 27A. The binary counter 27A, in turn, is controlled by A UP count up and A DN count down signals which it receives from the delay control circuit 22 over delay control bus 21. When the delay control circuit 22 asserts the A UP count up or the A DN count down signal, the counter counts up or down, respectively. The A delay path 25A, including the A delay line 26A, the counter 27A, and the shared delay line 30, will be described in greater detail below in connection with FIGS. 3A through 3C.

The counter 27A generates binary-encoded AC(8.0) counter output signals coupled to the A delay line 26A to control the amount of delay provided thereby. In addition, when the counter 27A counts beyond either the upper or the lower end of its range, such that the binary-encoded value of the AC(8:0) counter output signals equals zero, it asserts an A WRAP signal, which is transmitted to the delay control circuit 22 over the delay status bus 24. In response to the assertion of the A WRAP signal, the delay control circuit 22 asserts an A LD load enabling signal which enables the counter to load an initialization value in the mid-point of its range. Preferably, the counter 27A provides a sufficient range of values for the AC(8:0) counter output signals so that the amount delay provided by the A delay path 25A can vary over several periods of the SYS CLK IN system clock in signal.

The B delay path 25B includes a B delay line 26B and binary counter 27B, which are similar to the A delay line 26A and binary counter 27A described above, and which operate in the same manner to generate a B DEL CLK delayed clocking signal. A selector circuit 31, under control of a DEL PATH SEL delay path select signal from the delay control circuit 22, selectively couples one of the A DEL CLK or B DEL CLK delayed clocking signals as the COMP DEL CLK composite delayed clock for transmission to the buffer 11 (FIG. 1). The selector circuit 31, which will be described in greater detail below in connection with FIG. 4, also receives a global RESET signal, which initializes the selector circuit 31 to initially select the B DEL CLK delayed clock signal for coupling as the COMP DEL CLK composite delayed clock signal.

As noted above, the delay control circuit 22 alternately switches between the A and B delay paths 25A and 25B as it varies the delay provided by the variable delay element 20. More specifically, if, for example, the DEL PATH SEL delay path select signal enables the selector 31 to couple the B DEL CLK delayed clock signal as the COMP DEL CLK composite delayed clock signal, and if the delay control circuit 22 determines, based on the signals from the phase comparator 23 (FIG. 1), that the leading edges of the DEL CLK OUT REF delayed clock out reference signal leads the leading edges of the SYS CLK IN system clock in signal, the delay control circuit 22 will typically (1) condition the A UP count up and A DN count down signals to enable the counter 27A of the A delay path 25A to generate AC(8:0) counter output signals to, in turn, enable the A delay line 26A to provide a delay slightly greater than is then being provided by the B delay path 25B, and then (2) condition the DEL PATH SEL delay path select signal to enable the selector 31 to couple the A DEL CLK delayed clock signal as the COMP DEL CLK composite delayed clock signal. Since the A delay path 25A at that point provides a somewhat greater amount of delay than had been provided by the B delay path 25B, the amount of lead will be somewhat reduced and perhaps eliminated.

Similarly, if the delay control circuit 22 determines that the leading edges of the DEL CLK OUT REF delayed clock out reference signal lags the corresponding edges of the SYS CLK IN system clock in signal, the delay control circuit 22 will typically (1) condition the A UP count up and A DN count down signals to enable the counter 27A of the A delay path 25A to generate AC(8:0) counter output signals to, in turn, enable the A delay line 26A to provide an amount of delay that is slightly reduced from that then being provided by the B delay path 25B, and then (2) condition the DEL PATH SEL delay path select signal to enable the selector 31 to couple the A DEL CLK delayed clock signal as the COMP DEL CLK composite delayed clock signal. Since the A delay path 25A at that point provides a somewhat reduced amount of delay than had been provided by the B delay path 25B, the amount of lag will be somewhat reduced and perhaps eliminated.

The delay control circuit 22 will perform similar operations to adjust the B delay path 25B if it detects a lead or lag in the DEL CLK OUT REF delayed clock output reference signal, in relation to the SYS CLK IN system clock in signal, while the selector 31 is coupling the A DEL CLK delayed clock signal as the COMP DEL CLK composite delayed clock signal. In addition, the delay control circuit initiates these operations iteratively, alternately enabling adjustment of delay provided by delay paths 25A and 25B and the coupling of the respective A DEL CLK delayed clock or B DEL CLK delayed clock signal by the selector 31, until the phase comparator 23 determines that the edges of the DEL CLK OUT REF delayed clock out reference signal occur at the same times as corresponding edges of the SYS CLK IN system clock in signal.

To accommodate this operation, the variable delay element 20 also provides two phase comparators 32A and 32B in, respectively, the A and B delay paths 25A and 25B. The phase comparator 32A receives the A DEL CLK delayed clock signal from the A delay line 26A and compares its phase to that of the B DEL CLK delayed clock signal from the B delay line 26B. That is, the phase comparator 32A asserts an A LAG B signal if the A DEL CLK delayed clock signal lags the B DEL CLK delayed clock signal, and an A LEAD B signal if the A DEL CLK delayed clock signal leads the B DEL CLK delayed clock signal. The phase comparator 32B performs similar operations in comparing the phase of the B DEL CLK delayed clock signal to that of the A DEL CLK delayed clock signal, and asserts a B LAG A signal if the B DEL CLK delayed clock signal lags the A DEL CLK delayed clock signal, and a B LEAD A signal if the B DEL CLK delayed clock signal leads the A DEL CLK delayed clock signal.

The A LAG B, A LEAD B, B LAG A, and B LEAD A signals are coupled over the delay status bus 24 to the delay control circuit 22. The delay control circuit 22, in turn, uses the signals to determine when it has adjusted the delay provided by the respective A or B delay path 25A or 25B to provide the required increase or decrease in delay in relation to the delay provided by the delay path then providing the COMP DEL CLK composite delayed clock signal. When the delay control circuit 22 determines that the delay path being adjusted provides the required increase or decrease in delay, it then enables the selector 31 to switch, to thereby couple the delayed clock signal provided thereby as the COMP DEL CLK composite delayed clock signal.

Figure 2:
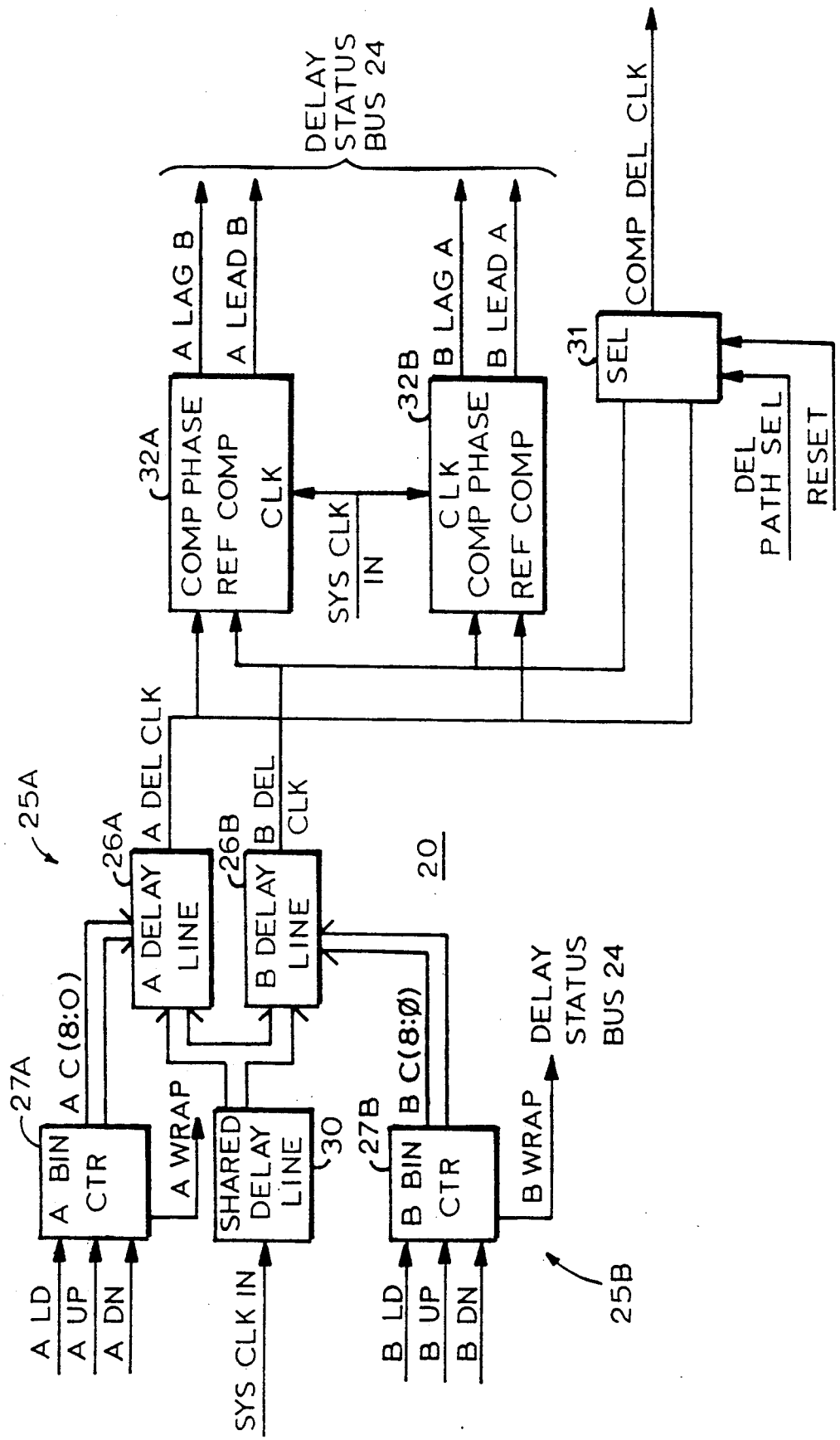
FIG. 2 depicts a functional block diagram of a voltage controlled delay element and delay control element useful in the clock buffer circuit depicted in FIG. 1.
Figure 2:
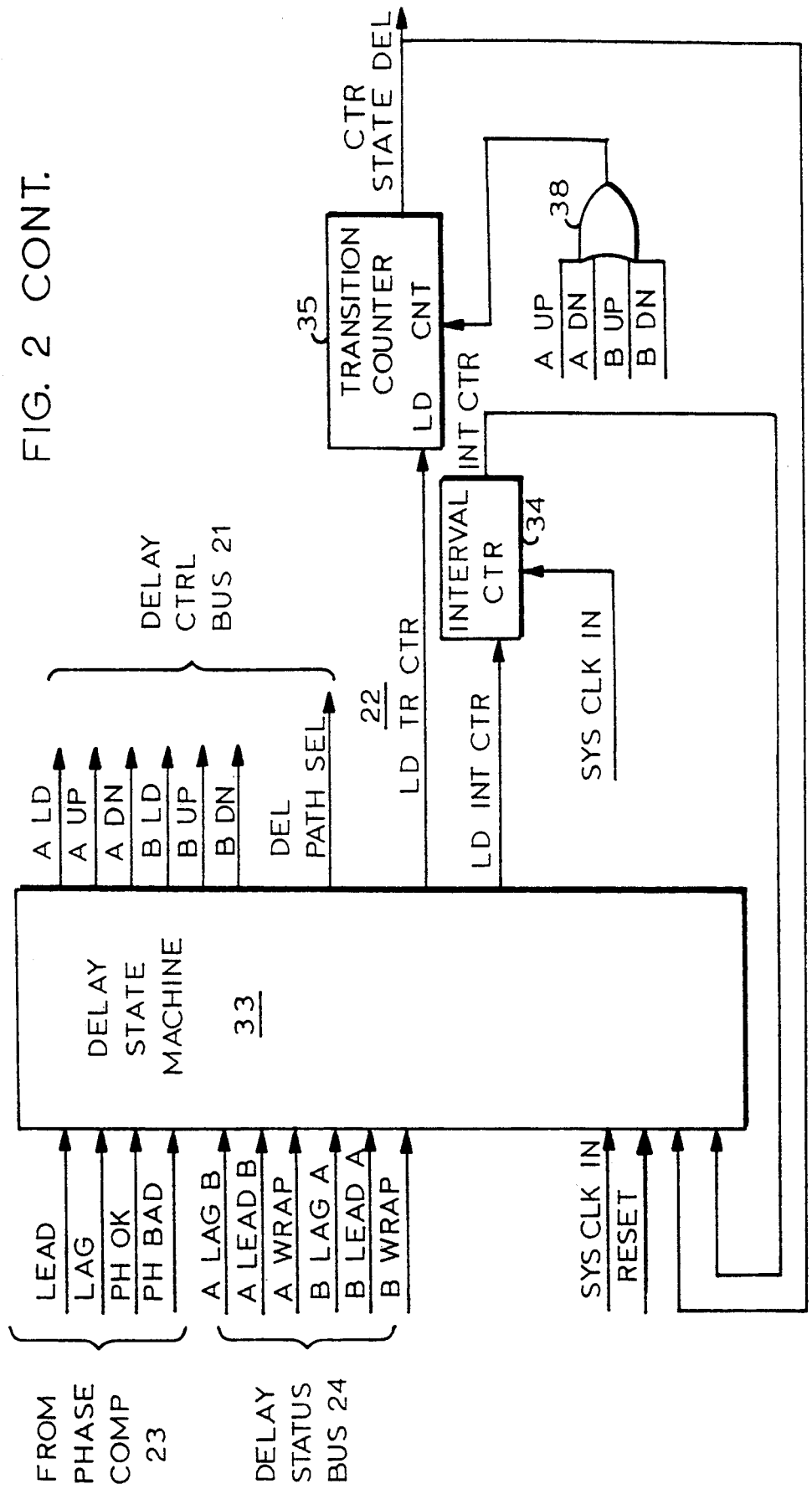

FIG. 2 also depicts elements comprising the delay control circuit 22. The delay control circuit 22 includes a state machine 33, an interval counter 34 and a transition counter 35. The state machine receives the signals from phase comparator 23 (FIG. 1), and the signals from phase comparators 32A and 32B over the delay status bus 24, as well as INT CTR interval counter and CTR STATE DEL counter state delay signals from the interval counter 34 and transition counter 35. In response thereto, and to the SYS CLK IN system clock in signal, the state machine 33 generates the signals that control the binary counters 27A and 27B to adjust the delays provided by the A and B delay paths 25 A and 25 B, respectively. In addition, the state machine 33 generates the DEL PATH SEL delay path select signal to control delay path selection by the selector 31. The states provided by state machine 33, and the transitions therebetween, will be further described below in connection with FIG. 5.

The state machine 33 uses the interval counter 34 to provide a delay following selection of one delay path 25 by the selector 31 before it begins adjusting the other delay path 25. This ensures that the change in phase in the DEL CLK OUT REF delayed clock output reference signal caused by the switch to the new delay path 25 is fully reflected in the signals from the phase comparator 23 before the state machine 33 initiates a new adjustment operation. The state machine 33 may also use the interval counter 34 while it is adjusting the phase of a delay path 25 to ensure that the step in the change of phase of the respective A DEL CLK or B DEL CLK delayed clock signal, following each adjustment of the appropriate counter 27, is reflected in the signals provided by the corresponding phase comparator 32.

The state machine 33 uses the transition counter 35 during an initial portion of the delay adjustment provided by a delay path 25. As will be described below in greater detail in connection with FIG. 5, the state machine 33, when it begins adjusting the delay provided by a delay path 25A or 25B, first adjusts the delay a predetermined number of counts, as provided by respective counter 27A or 27B, in the opposite direction. That is, if the state machine 33 is to reduce the amount of delay provided by a delay path 25A or 25B under adjustment, it first increases the amount of delay provided by that delay path by an amount to ensure that the delay provided thereby is slightly greater than that provided by the other delay path 25B or 25A then being selected by selector 31. The state machine 33 may iteratively use the transition counter until the delay path 25A or 25B to be adjusted has the required delay relationship with the delay path 25B or 25A then selected by selector 31.

Figure 3A:
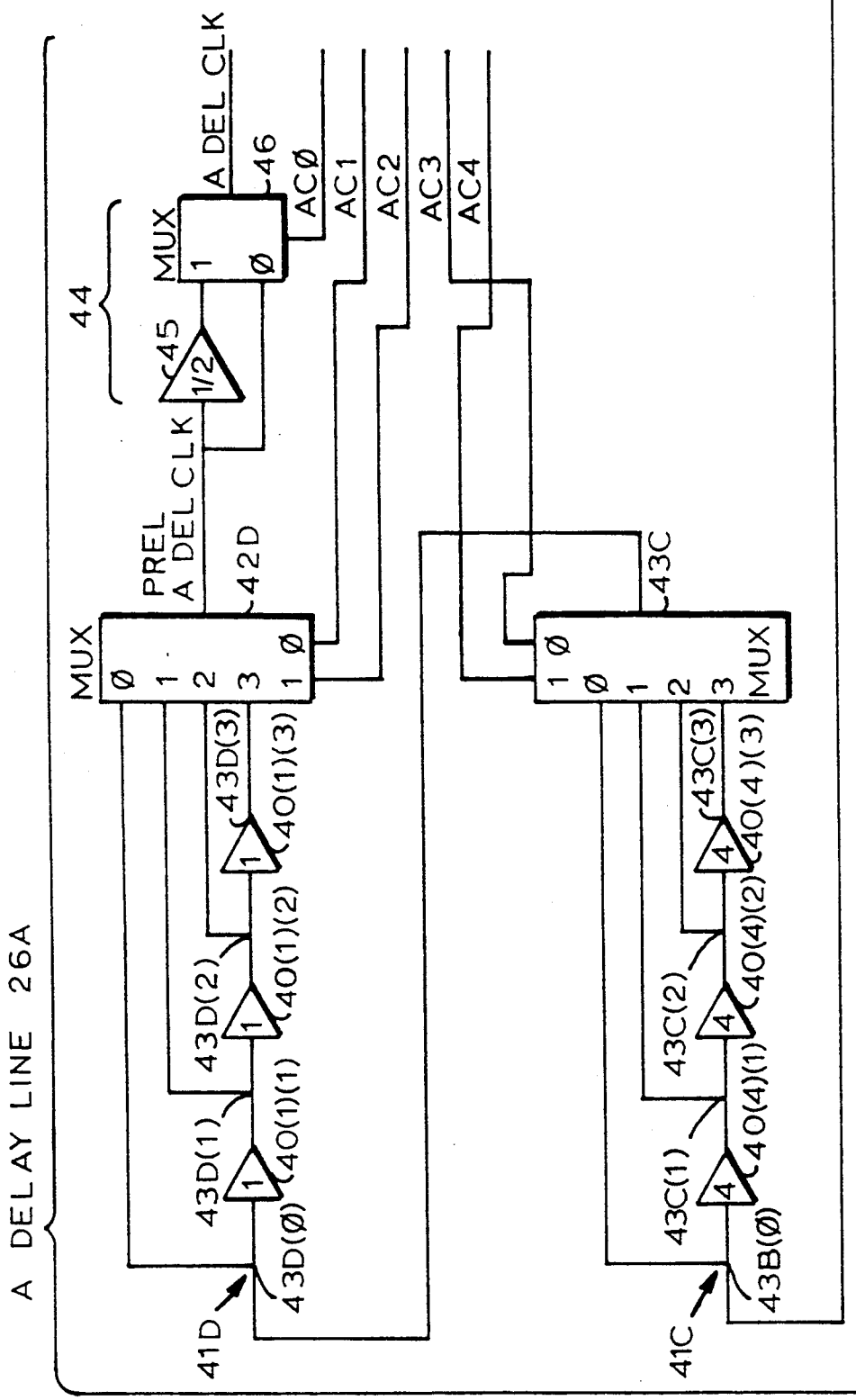
FIGS. 3A and 3B together depict a logic diagram of a delay line.
Figure 3B:
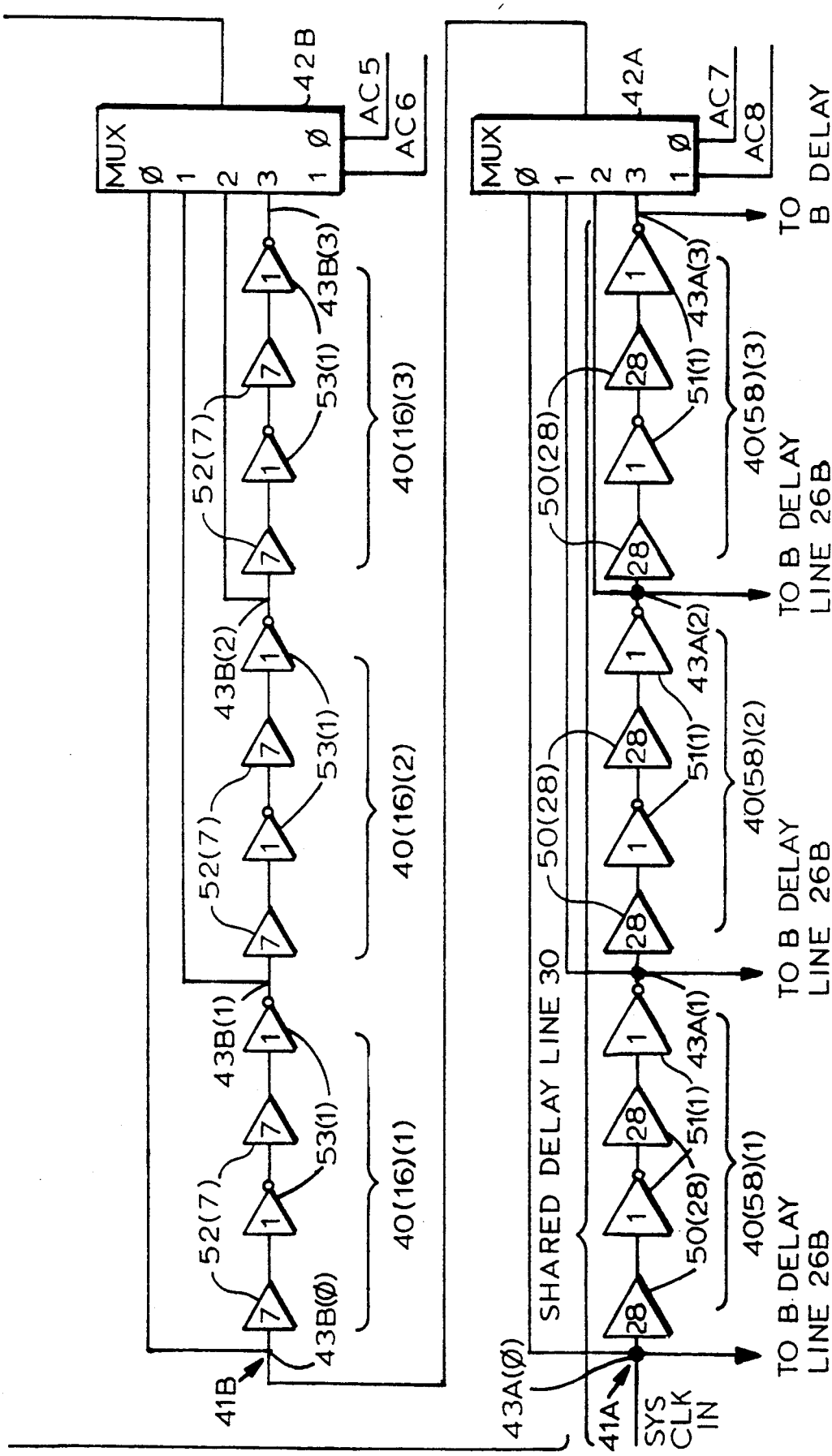
Figure 3C:
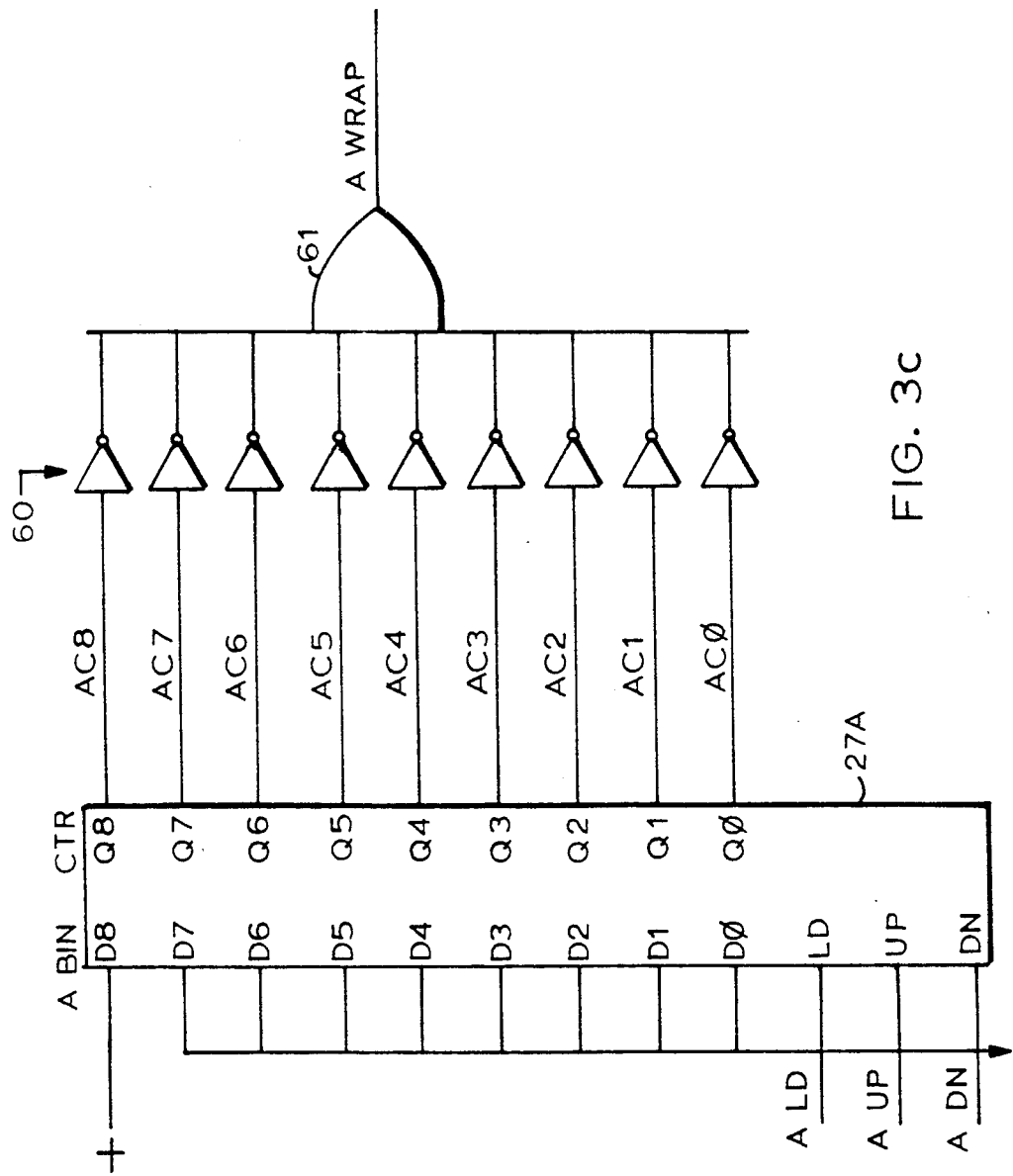
FIG. 3C depicts a delay control counter, all of which are useful in the voltage controlled delay element depicted in FIG. 2.

FIGS. 3A through 3C jointly depict a detailed logic diagram of a portion of the A delay path 25A, namely, the A delay line 26A, the shared delay line 30 (which is shared with the B delay path 25B) and the binary counter 27A. With reference to FIGS. 3A and 3B, the A delay line 26A and the shared delay line 30 include a set of delay elements, generally identified by reference numeral 40(i)(j). The index "i" in reference numeral 40(i)(j), which can comprise an integer from the group "1," "4," "16," and "58," identifies a relative amount of delay that can be provided by the delay element. The delay elements 40(i)(j) are serially interconnected by multiplexers 42A through 42D, under control of the AC(8:1) counter control signals, to provide incrementally larger or smaller amounts of delay.

As shown in FIGS. 3A and 3B, the delay elements 40(i)(j) are connected in four serially-connected ranks 41A through 41D, with each rank being associated with one value of the index (i). The first delay element 40(58)(1) of the first rank 41A receives the SYS CLK IN system clock in signal, and the delay elements 40 of the first rank 41A comprise the shared delay line 30. The delay elements 40(i)(j) in each rank 41 are connected in series, and the index (i) in reference numeral 40(i)(j) identifies the position of the delay element 40(i)(j) in the series comprising the rank 41. It will be appreciated that all of the delay elements 40(i)(j) in a rank 41 provide the same amount of delay, and the amount of delay provided by a single delay element 40(i)(j) of a rank 41C and 41B is one delay period greater than that provided by the delay elements of the succeeding ranks 41B and 41A in the series. In the embodiment described in connection with FIGS. 3A and 3B, the amount of delay provided by a delay element 40(58)(j) in rank 41A is slightly less than the amount of delay provided by the delay elements of succeeding ranks 41C through 41A.

The A delay path also includes a set of multiplexers 42A through 42D (generally identified by reference numeral 42), each associated with one of the ranks 41A through 41D, for connecting the rank to the succeeding rank. Each multiplexer 42 is controlled by two of the AC(8:1) counter signals from counter 27A, to establish the incremental amount of delay for the rank. Each multiplexer 42 includes four signal input terminals that receives input signals from nodes 43A(0) through 43D(3) that are associated with the delay elements 40(i)(j) in its rank. That is, in rank 41A, signals at nodes 43A(0) through 43A(3), which corresponds respectively to:

(0) the input terminal at delay element 40(58)(1), representing zero delay in rank 41A;

(1) the node between delay element 40(58)(1) and 40(58)(2), representing fifty-eight increments of delay;

(2) the node between delay element 40(58)(2) and 40(58)(3), representing one hundred and sixteen (two times fifty-eight) increments of delay; and (3) the output terminal delay element 40(58)(3), representing one hundred and seventy-four (three times fifty-eight) increments of delay;

are coupled to the data signal input terminals (0) through (3) respectively, of multiplexer 42A. The multiplexer 42A also includes two control terminals which receive the two high-order binary encoded AC(8:7) counter signals, which enable the multiplexer to couple the signal from one of the nodes 43(A)(0), as identified by the binary-encoded value of the AC(8:7) counter signals, to the next rank.

Each of the other multiplexers 42B, 42C and 42D are similarly connected to corresponding nodes in their associated ranks and performs similar operations in connection therewith. Thus, multiplexer 42D provides a PREL A DEL CLK preliminary delayed clock signal whose edges are delayed from the corresponding edges of the SYS CLK IN system clock input signal by an amount determined by the AC(8:1) counter signals.

The A delay path 26A also includes a fine delay circuit 44 that provides a fine delay adjustment in response to the AC(0) counter signal. The fine delay circuit 44 includes a delay element 45 and a multiplexer 46 which transmits the A DEL CLK delayed clock signal under control of the AC(0) counter signal. The delay element 45 receives the PREL A DEL CLK preliminary delayed clock signal, and provides an output signal that has an additional one-half increment of delay. Both the output signal from the delay element 45 and the PREL A DEL CLK preliminary delayed clock signal are coupled to signal input terminals of the multiplexer 46. If the AC(0) counter signal is negated, so that it has a binary-encoded value of zero, the multiplexer 46 couples the PREL A DEL CLK preliminary delayed clock signal to its output terminal as the A DEL CLK delayed clock signal. On the other hand, if the AC(0) counter signal is asserted, so that it has a binary-encoded value of one, the multiplexer 46 couples the output signal from the delay element 45 to its output terminal, to thereby provide and additional one-half increment of delay.

As will be appreciated by those skilled in the art, as the AC(8:0) counter signals varies through its range, the A delay path 25A can provide amounts of delay which vary from zero, if the binary-encoded value of the AC(8:0) counter signals is zero, to two hundred thirty-seven and one-half units of delay, if the binary-encoded value of the AC(8:0) counter signals is five hundred and eleven, in increments of one-half unit.

As noted above, in the embodiment described in connection with FIGS. 3A and 3B, each delay element 40(58)(j) in the first rank 41A does not provide an amount of delay equal to the delay provided by all of the delay elements 40(i)(j) of the succeeding ranks 41B through 41D. Accordingly, the change in delay as a function of changing the binary value of the AC(8:0) counter signals will not be precisely linear. Instead, there will be slight discontinuities, in particular a reduction of approximately five and one-half increments of delay, when the binary encoded values of the AC(8:7) counter signals change. Since it is currently difficult to ensure that delay elements, particularly those providing large amounts of delay, on an integrated circuit chip will provide accurate amounts of delay, this slight reduction provided in the first rank reduces the likelihood of large differentially non-linear increases or decreases in the amount of delay provided when the multiplexer 42A adds or deletes delays provided by delay elements 40(58)(j) in response to changes in the AC(8:7) counter signals. If delay elements of sufficient accuracy can be provided for the first rank 41A, the aforementioned reduction is not necessary.

Each of the delay elements 40(58)(j) of the first rank 41A is shown in FIGS. 3A and 3B as comprising two delay devices 50(28) and two inverters 51(1), with the index identifying the relative amount of delay provided thereby. Similarly, the delay elements 40(16)(j) of the second rank 41B is shown as comprising two delay devices 52(7) and two inverters 53(1). Delay elements providing lengthy delays, such as those used in ranks 41A and 41B, may tend to provide output signals with somewhat different duty cycles as the input signals. However, dividing the delay elements into multiple delay devices interleaved with inverters helps to ensure that the output signal provided by the delay element will have the same duty cycle as the delay element's input signal.

As noted above, the delay elements 40(58)(j) in the first rank 41A comprise the shared delay line 30, which is shared with the B delay path 25B. Delay elements 40(58)(j) can be shared since the selection of the amount of delay provided by the first rank is performed by multiplexer 42A, which follows in the circuit after all of the delay elements 40(58)(j) in the circuit.

FIG. 3C depicts a logic diagram of the counter 27A in the A delay path 25A. The counter is a nine-stage binary counter that includes data input terminals D8 through D0, which are used to receive an initial value which can be loaded into the counter, a load enabling terminal LD, a count up terminal UP and a count down terminal DN. The counter 27A generates, as output signals, nine AC(8:0) counter output signals having binary encoded values ranging between zero and five hundred and eleven. As noted above, the delay control circuit 22 initially establishes the value of the counter 27A at the middle of its range, which may be selected as two hundred fifty five or two hundred and fifty six. In the embodiment shown in FIG. 3C, the initial value is selected to be two hundred and fifty six, which can be established by connecting the D7 through D0 data input terminals to ground and energizing the D8 data input terminal. Alternately, the D8 data input terminal can be connected to ground, and the D0 through D7 data input terminals energized, which would provide an initial value of two hundred and fifty five. In either case, the delay control circuit 22 can enable the counter to load the initial value by asserting the A LD load signal.

After enabling the counter 27 to load the initial value, the delay control circuit can enable the counter to alternately count up and down by asserting the A UP count up or A DN count down signal, which energize the count up terminal UP or count down terminal DN, respectively. In response, the counter 27A asserts and negates selected ones of the AC(8:0) counter signals in a conventional manner having increased or decreased binary encoded values to enable the A delay line 26A to increase or decrease the delay provided thereby.

As noted above, when the counter 27A counts beyond either end of its range it asserts the A WRAP signal which enables the delay control circuit 22 enables the counter to re-load its initial value. The counter 27A has counted beyond an end of its range when it generates value zero, which can occur if the counter counts down from value one or up from value two hundred and fifty five. In either case, the value zero is represented by the negation of all of the AC(8:0) counter signals. The input terminals of a set of inverters 60 are connected to receive all of the AC(8:0) counter signals. The output terminals of the inverters 60 are, in turn, connected to input terminals of an AND gate 61. When all of the AC(8:0) counter signals are negated, all of the inverters 60 energize all of the input terminals of the AND gate 61, enabling it to assert the A WRAP signal, which is coupled to the delay control circuit 22 over the delay status bus 24.

With reference again to FIG. 2, as noted above, the selector circuit 31 selects one of the A DEL CLK delayed clock signal, from A delay path 25A, or the B DEL CLK delayed clock signal, from B delay path 25B. The selector 31 makes the selection in response to the DEL PATH SEL delay path select signal from the delay control circuit 22. FIG. 4 depicts a logic diagram of selector 31. With reference to FIG. 4, the selector 31 includes a multiplexer 70, which receives at its data input terminals the A DEL CLK delayed clock signal and the B DEL CLK delayed clock signal. The multiplexer 70 couples one of these signals, as selected by a PATH MUX CTRL path multiplexer control signal from a multiplexer control circuit 71, as the COMP DEL CLK composite delayed clock signal. When the PATH MUX CTRL path multiplexer control signal is negated, the multiplexer 70 couples the A DEL CLK delayed clock signal as the COMP DEL CLK composite delayed clock signal, and when the PATH MUX CTRL path multiplexer control signal is asserted, the multiplexer 70 couples the B DEL CLK delayed clock signal as the COMP DEL CLK composite delayed clock signal.

The multiplexer control circuit 71 operates in response to the DEL PATH SEL delay path select signal from the delay control circuit 22 and the SYS CLK IN system clock in signal. The multiplexer control circuit includes two sections, including a buffer section 72 and a synchronizer section 73. Generally, the buffer section 72 buffers the PATH MUX CTRL path multiplexer control signal from the DEL PATH SEL delay path select signal, and the synchronizer section 73 ensures that PATH MUX CTRL path multiplexer control signal does not enable the multiplexer 70 to change state unless both the A DEL CLK delayed clock signal and the B DEL CLK delayed clock signal are in a low-voltage state. This minimizes the likelihood of voltage spikes, glitches, and so forth, which may occur in the COMP DEL CLK composite delayed clock signal if the multiplexer 70 is permitted to switch if either the A DEL CLK delayed clock signal and the B DEL CLK delayed signal are at a high voltage level.

With this background, the buffer section 72 includes three flip-flops 74, 75 and 76 which operate as a delay line, with the DEL (i) DPS delayed ("i" ticks) delay path select signal ("i" being an integer from 1 to 3) output signal from each successive flip-flop reflecting the condition of the DEL PATH SEL delay path select signal delayed by one, two or three ticks (as identified by the value of "i") of the SYS CLK IN system clock in signal. An exclusive-NOR gate 80 receives the signals at the data input and output terminals of the flip-flop 76, and controls the condition of a multiplexer 81 which, in turn, determines the source of a signal coupled to the data input terminal of a fourth flip-flop 82 in the buffer section. In particular, the multiplexer 81 determines whether the data input terminal of flip-flop 82 receives the DEL (3) DPS delayed (3 ticks) delay path select signal from flip-flop 76 or a CUR PATH current path signal transmitted by the flip-flop 82. As described below, the exclusive-NOR gate 80, multiplexer 81 and flip-flop 82 reduce the susceptibility of the CUR PATH current path signal to noise that may be present in the DEL PATH SEL delay path select signal from the delay control circuit 22.

More particularly, if the state of the DEL PATH SEL delay path select signal is constant, the DEL (2) DPS and DEL (3) DPS delayed ("i" ticks) delay path select signals will be the same. In that case, the exclusive-NOR gate 80 generates an asserted CH DEL change delay signal, which, in turn, enables multiplexer 81 to couple the DEL (3) DPS delayed (3 ticks) delay path selection signal from the output terminal of flip-flop 76 to the data input terminal of the next flip-flop 82 in the buffer section 72. The flip-flop 82 transmits a CUR PATH current path signal reflecting the current state of the DEL PATH SEL delay path select signal.

If, however, the DEL PATH SEL delay path select signal changes state, the new state of the DEL PATH SEL delay path select signal will be latched first by the flip-flop 74 and next by the flip-flop 75, in response to successive edges of the SYS CLK IN system clock in signal. At this point, the state of the DEL (2) DPS delayed (2 ticks) delay path select signal input to flip-flop 76 is the complement of the DEL (3) DPS delayed (3 ticks) delay path select signal, and will reflect the new state of the DEL PATH SEL delay path select signal. Since the states of the DEL (2) DPS delayed (2 ticks) delay path select signal and the DEL (3) DPS delayed (3 ticks) delay path select signal are complementary, the exclusive-NOR gate 80 generates a negated CH DEL change delay signal. In response, multiplexer 81 is conditioned to couple the CUR PATH current path signal, transmitted by another flip-flop 82 in the buffer section 72, to the data input terminal of the same flip-flop 82, enabling the flip-flop to maintain its state.

If the DEL PATH SEL delay path select signal remains in the new state, the next edge of the SYS CLK IN system clock in signal will enable the flip-flop 76 to latch the DEL (2) DPS delayed (2 ticks) delay path select signal. At that point, the DEL (3) DPS delayed (3 ticks) delay path select signal will have the same condition as the DEL (2) DPS delayed (2 ticks) delay path select signal. As a result, the input signals to exclusive-NOR circuit 80 will have the same state, resulting in assertion of the CH DELAY change delay signal. The asserted CH DELAY change delay signal enables the multiplexer 81 to couple the DEL (3) DPS delayed (3 ticks) delay path select signal to the data input terminal of the flip-flop 82. Flip-flop 82, in turn, will latch the DEL (3) DPS delayed (3 ticks) delay path select signal coupled to it by multiplexer 81 in response to the next edge of the SYS CLK IN system clock in signal. At that point, the CUR PATH current path signal will have the same state as the DEL (3) DPS delayed (3 ticks) delay path select signal.

Thereafter, until the DEL PATH SEL delay path select signal again changes state, the CUR PATH current path signal will remain constant. Until the DEL PATH SEL delay path select signal changes state, the states of the DEL (2) DPS delayed (2 ticks) delay path select and DEL (3) DPS delayed (3 ticks) delay path select signals will not change. As a result, the exclusive-NOR gate 80 will maintain the CH DELAY change delay signal in an asserted condition, enabling the multiplexer 81 to couple the DEL (3) DPS delayed (3 ticks) delay path select signal to flip-flop 82.

As noted above, the combination of the flip-flop 76, exclusive-NOR gate 80 and multiplexer 81 reduces the susceptibility of the buffer 72 to noise in the DEL PATH SEL delay path select signal. The noise may be reflected in momentary changes in the condition of the DEL PATH SEL delay path select signal as received at flip-flop 74. In particular, if the DEL PATH SEL delay path select signal is noisy, such that it changes state momentarily and then returns to its original state, those changes will be reflected in the states of the succeeding DEL (i) DPS delayed ("i" ticks) delay path select signals. As a result, the DEL (2) DPS and DEL (3) DPS delayed ("i" ticks) delay path select signals will have complementary and alternating conditions at two successive edges of the SYS CLK IN system clock in signal, rather than just one. During that time, the exclusive-NOR gate 80 will continue negating the CH DELAY change delay signal, enabling, in turn, the multiplexer 81 to continue coupling the CUR PATH current path signal to the data input terminal of flip-flop 82 and thereby inhibiting any change in the condition of the flip-flop 82 or the CUR PATH current path signal transmitted thereby. Thus, the flip-flop 76, exclusive-NOR gate 80 and multiplexer 82 provide a degree of immunity from noise in the DEL PATH SEL delay path select signal.

The synchronizer section 73 includes a flip-flop 83 which receives at its data input terminal the CUR PATH current path signal from the buffer section 72 and which transmits the PATH MUX CTRL path multiplexer control signal for controlling the multiplexer 70. The flip-flop 83 is clocked by an AND gate 84 which has two input terminals, one energized by a NOR gate 85 and the other energized by a state change detection circuit 86. The state change detection circuit 86 detects when the states of the CUR PATH current path signal and PATH MUX CTRL path multiplexer control signal differ, and at that time energizes its input terminal of the AND gate 84. The state change detection circuit includes an exclusive-OR gate 87 and a flip-flop 90. The exclusive-OR gate 87 receives the CUR PATH current path and PATH MUX CTRL path multiplexer control signals and is energized only if the two signals differ. This occurs if the multiplexer 70 is switch between the delay paths 25A and 25B. If the exclusive-OR gate 87 is energized, the flip-flop 90 is set in response to the next edge of the SYS CLK IN system clock in signal, thereby transmitting an asserted signal to one input terminal of the AND gate 84.

The NOR gate 85, which controls the other input terminal of AND gate 84, is controlled by the A DEL CLK delayed clock and B DEL CLK delayed clock signals. In particular, the NOR gate 85 generates an asserted output signal only if both of the delayed clock signals are negated. When signals at both input terminals of AND gate 84 are asserted, the AND gate 84 asserts a CLK FF clock flip-flop signal, whose edge clocks the flip-flop 83. In response, the flip-flop 83 latches the CUR PATH current path signal, which it transmits as the PATH MUX CTRL path multiplexer control signal to control the multiplexer 70.

The synchronizer section 73 thus (1) avoids clocking the flip-flop 83 unless the condition of the CUR PATH current path signal differs from that of the PATH MUX SEL path multiplexer select signal, and then (2) only at points in time at which both the A DEL CLK and B DEL CLK delayed clock signals are in their low voltage conditions. The second minimizes the likelihood of noise which may occur in the COMP DEL CLK composite delay clock signal which can result if the multiplexer 70 is switched while either of the A DEL CLK or B DEL CLK delayed clock signals are in their high voltage conditions. The first ensures that the flip-flop 83 is clocked only when necessary, similarly reducing the likelihood of noise.

The selector 31 also operates in response to the global RESET signal from a system controller (not shown) which controls a system including the chip containing the clock buffer circuit 10. The RESET signal initially conditions the flip-flops of the selector 31 to generate a PATH MUX CTRL path multiplexer control signal which, in turn, conditions the multiplexer 70 to couple the B DEL CLK delayed clock signal from the B delay path 25B as the COMP DEL CLK composite delayed clock signal.

Figure 5:
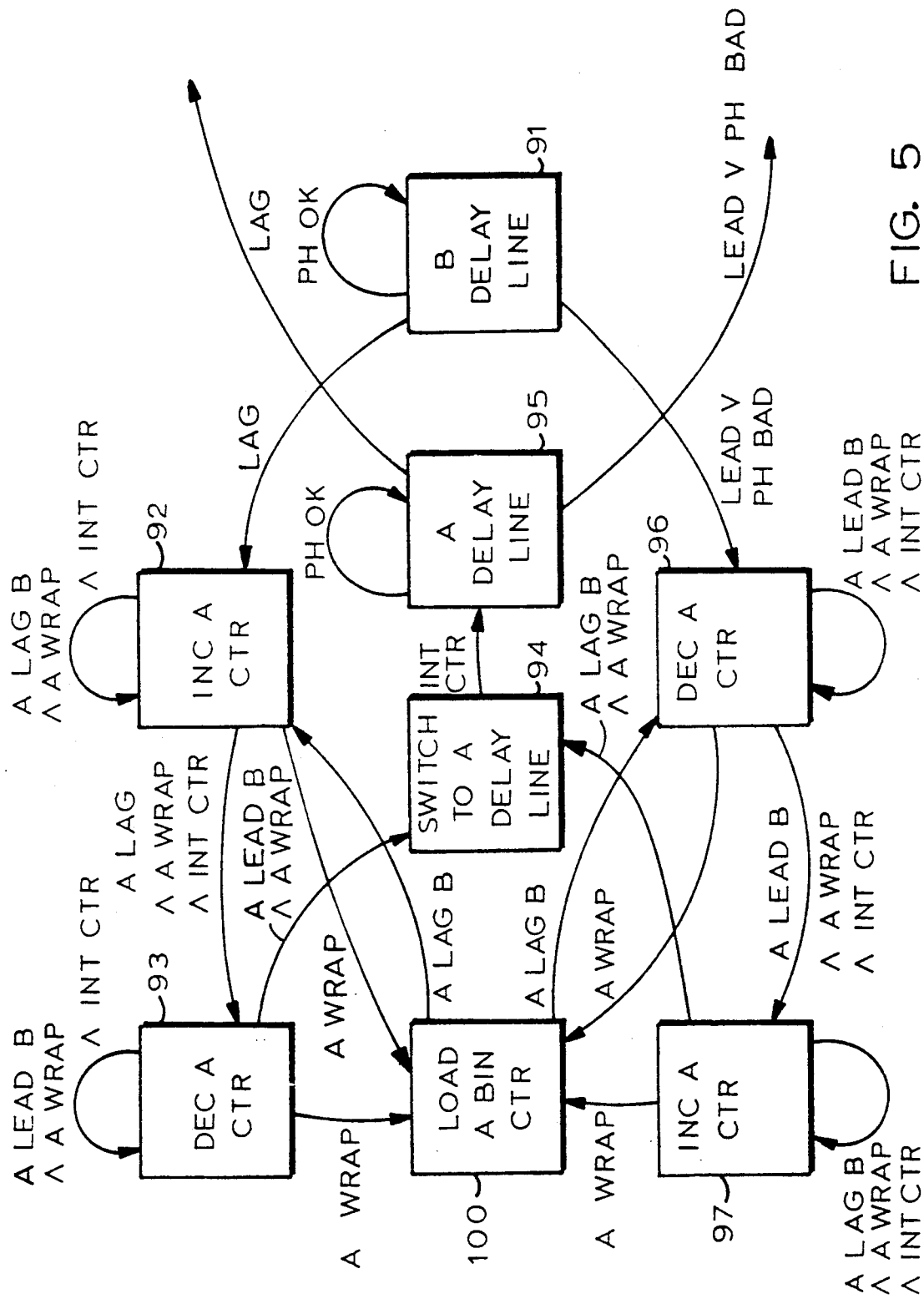
FIG. 5 is a state diagram useful in understanding the operations of the delay control element depicted in FIGS. 1 and 2.

As described above, the delay state machine 33 (FIG. 2) in the delay control circuit 22 (FIG. 1) sequences through a plurality of states in controlling the variable delay element 20. FIG. 5 contains a state diagram which is useful in understanding the states maintained by delay state machine 33. With reference to FIG. 5, each block represents a state of the delay state machine 33, and each arrow represents a transition. Each arrow is also marked with the logical combination of input signals received by the delay state machine 33 which causes the particular transition. In cases in which arrows extend from block to block, they represent transitions from one state to another. In other cases, in which arrows extend from and return to the same block, the arrows represent transitions from a state to the same state.

For each arrow shown in FIG. 5, the manner in which input signals is logically combined is indicated using conventional Boolean logic symbols, that is, a "V" representing a Boolean OR operation, and an upside-down "Λ" representing a Boolean AND operation. The state of a signal which may give rise to a transition is indicated by whether the signal name has a bar thereover; if the signal name has no bar over it, the indicated transition may occur if the signal is asserted, but if the signal name does have a bar thereover, a transition may occur if the signal is negated.

FIG. 5 actually represents approximately half of the states maintained by delay state machine 33, in particular those relating to A delay path 25A. The states maintained by B delay path 25B, and signals causing transitions therebetween, are similar. Accordingly, a description of states and transitions relating to the A delay path 25A should suffice for an understanding of the operation of the delay state machine 33. If the delay state machine 33 is initially in a state 91 ("B DELAY LINE"), it is asserting the DEL PATH SEL delay path select signal, enabling the selector 31 to couple the B DEL CLK delayed clock signal as the COMP DEL CLK composite delayed clock signal. Before sequencing into state 91, the interval counter 34 (FIG. 2) has counted out, so that delay state machine 33 has asserted the DEL PATH SEL delay path select signal for a period of time determined by the interval counter 34.

If the delay state machine is in state 91, if the phase comparator 23 (FIG. 1) thereafter asserts the LAG signal, the delay state machine 33 sequences to a state 92 ("INC A CTR"). In that state, the delay state machine iteratively asserts the A UP count up signal a predetermined number of times, and thereafter determines whether the A DEL CLK delayed clock signal from A delay path 25A lags the B DEL CLK delayed clock signal. The number of times the delay state machine 33 asserts the A UP count up signal is determined by the transition counter 35. Accordingly, in state 92, the delay state machine 33 actually maintains several sub-states, in which it:

(i) Asserts a LD TR CTR load transition counter signal to load an initial value into the transition counter 35.

(ii) Iteratively asserts the A UP count up signal. The counter 27A uses the A UP count up control signal as described above. In addition, an OR gate 38 receives the A UP count up signal and enables the transition counter 35 to count up. When the transition counter 35 has counted out, it asserts a CTR STATE DEL counter state delay signal.

(iii) In response to the CTR STATE DEL counter state delay signal, the delay state machine stops assertions of the A UP count up signal and instead asserts an LD INT CTR load interval counter signal enabling the interval counter 34 to load an initial value. Thereafter, the interval counter 34 increments in response to ticks of the SYS CLK IN system clock in signal. When the interval counter counts out, it asserts a INT CTR interval counter signal.

In response to the INT CTR interval counter signal from interval counter 34, the delay state machine 33 tests the A LAG B and A WRAP signals. If these signals are negated, the delay state machine 33 performs a transition in which it returns to state 92 and again initiates the above-described operations. If, however, the delay state machine 33 determines, when the interval counter 34 has asserted the INT CTR interval counter signal in sub-state (iii) above, that (a) the A LAG B signal is asserted, indicating that the A DEL CLK delayed clock signal lags the B DEL CLK delayed clock signal, and (b) the A WRAP signal is negated, it sequences to a state 93 ("DEC A CTR").

In state 93, the delay state machine 33, in one or more iterations, asserts the A DN count down signal to enable the counter 27A to count down, decreasing the delay provided by the A delay path, and following each assertion, enables the interval counter 34 and, after the counter 34 has counted out, tests the A LEAD B signal. If the A LEAD B signal is not asserted at the end of an iteration, the delay state machine performs another iteration. In state 93, the delay state machine 33 effectively enables a delay in A delay path 25A which is incrementally less than the delay currently provided by the B delay path 25B. More specifically, in state 93, the delay state machine 33 maintains three sub-states, in which it:

(i) Asserts the A DN count down signal. The counter 27A uses the A DN count down signal as described above.

(ii) Asserts the LD INT CTR load interval counter signal enabling the interval counter 34 to load an initial value. Thereafter, the interval counter 34 increments in response to ticks of the SYS CLK IN system clock in signal. When the interval counter counts out, it asserts a INT CTR interval counter signal.

(iii) In response to the INT CTR interval counter signal from interval counter 34, the delay state machine 33 tests the conditions of the A LEAD B and A WRAP signals. If these signals are negated, the delay state machine 33 performs a transition in which it returns to state 93 and again initiates the above-described operations. If, however, the delay state machine 33 determines, when the interval counter 34 has asserted the INT CTR interval counter signal in sub-state (ii) above, that (a) the A LEAD B signal is asserted, indicating that the A DEL CLK delayed clock signal leads the B DEL CLK delayed clock signal, and (b) the A WRAP signal is negated, it sequences to a state 94 ("SWITCH TO A DELAY LINE").

In state 94, the delay state machine 33 negates the DEL PATH SEL delay path select signal, enabling the selector 31 (FIG. 2) to couple the A DEL CLK delayed clock signal as the COMP DEL CLK composite delayed clock signal. In addition, the delay state machine 33 asserts the LD INT CTR load interval counter signal to load an initial value into the interval counter 34. When the interval counter counts out and asserts the INT CTR interval counter signal, the delay state machine 33 sequences to a state 95 ("A DELAY LINE"), which corresponds to the state 91.

Returning to state 91, if the LEAD or PH BAD out-of-phase signals is asserted, the delay state machine 33 sequences to state 96 and thereafter state 97, which are analogous to states 92 and 93 described above and will not be described in detail. It will be appreciated that in state 96 the delay state machine 33 in part uses the A LEAD B signal (instead of the A LAG B signal used in state 92) to determine whether to sequence out of the state, and in state 97 it uses in part the A LAG B signal (instead of the A LEAD B signal used in state 93) to determine whether to sequence out of the state. Following step 97, the delay state machine 33 normally will sequence to state 94 and thereafter to state 95, as described above.

As described above, the delay state machine 33 enters or remains in any of states 92, 93, 96 or 97 if the A WRAP signal from counter 27A (FIG. 2) is negated. If the A WRAP signal is ever asserted when the delay state machine 33 is in any of these states, it sequences to a state 100. In state 100, the delay state machine first asserts the A LD load enabling signal. As described above, the A LD load enabling signal enables the counter 27A to load an initialization value in the middle of its value range.

It will be appreciated that enabling adjustment of the counter 27A may substantially alter the phase relationship between the A DEL CLK and B DEL CLK delayed clock signal. Thus, before sequencing to either state 92 or 96 the delay state machine 33 enables the determination whether the resulting A DEL CLK delayed clock signal lags the B DEL CLK delayed clock signal, as indicated by the state of the A LAG B signal. If so, the delay state machine sequences to state 92, and otherwise it sequences to state 96.

State 100 thus comprises three sub-states, in which the delay state machine 33:

(i) Asserts the A LD load enabling signal. Counter 27A uses the signal as described above.

(ii) Asserts the LD INT CTR load interval counter signal to enable the interval counter 34 to load an initial value. Thereafter, the interval counter 34 increments in response to ticks of the SYS CLK IN system clock in signal. When the interval counter counts out, it asserts a INT CTR interval counter signal.

(iii) In response to the assertion of the IN CTR interval counter signal from interval counter 34, the delay state machine 33 tests the condition of the A LAG B signal from phase comparator 32A. If the A LAG B signal is asserted, the delay state machine 33 sequences to state 92, and if it is negated the delay state machine sequences to state 96. In either case, the delay state machine 33 thereafter operates as described above.

As noted above, FIG. 5 depicts states of the delay state machine that relate only to the A delay path 25A. It will be appreciated that the state diagram shown in FIG. 5 can be completed, to include the states relating to the B delay path 25B, by reflecting the diagram around a vertical axis between blocks 91 and 95 and interchanging "A" and "B" in the reflected portion. If the delay state machine 33 is in state 95 following adjustment of the delay provided by A delay path 25A, the delay state machine 33 remains in that state 95 if the PH OK in-phase signal from phase comparator 23 (FIG. 1) is asserted. If instead the LAG signal is asserted, the delay state machine 33 sequences instead to a state corresponding to state 92 and performs operations similar to those described above in connection with the delay counter 27B and using signals from the phase counter 32B. On the other hand, if the LEAD or PH BAD out-of-phase signal is asserted delay state machine sequences to a state corresponding to state 96 and performs operations similar to those described above, also in connection with the delay counter 27B and using signals from the phase counter 32B.

Figure 6:
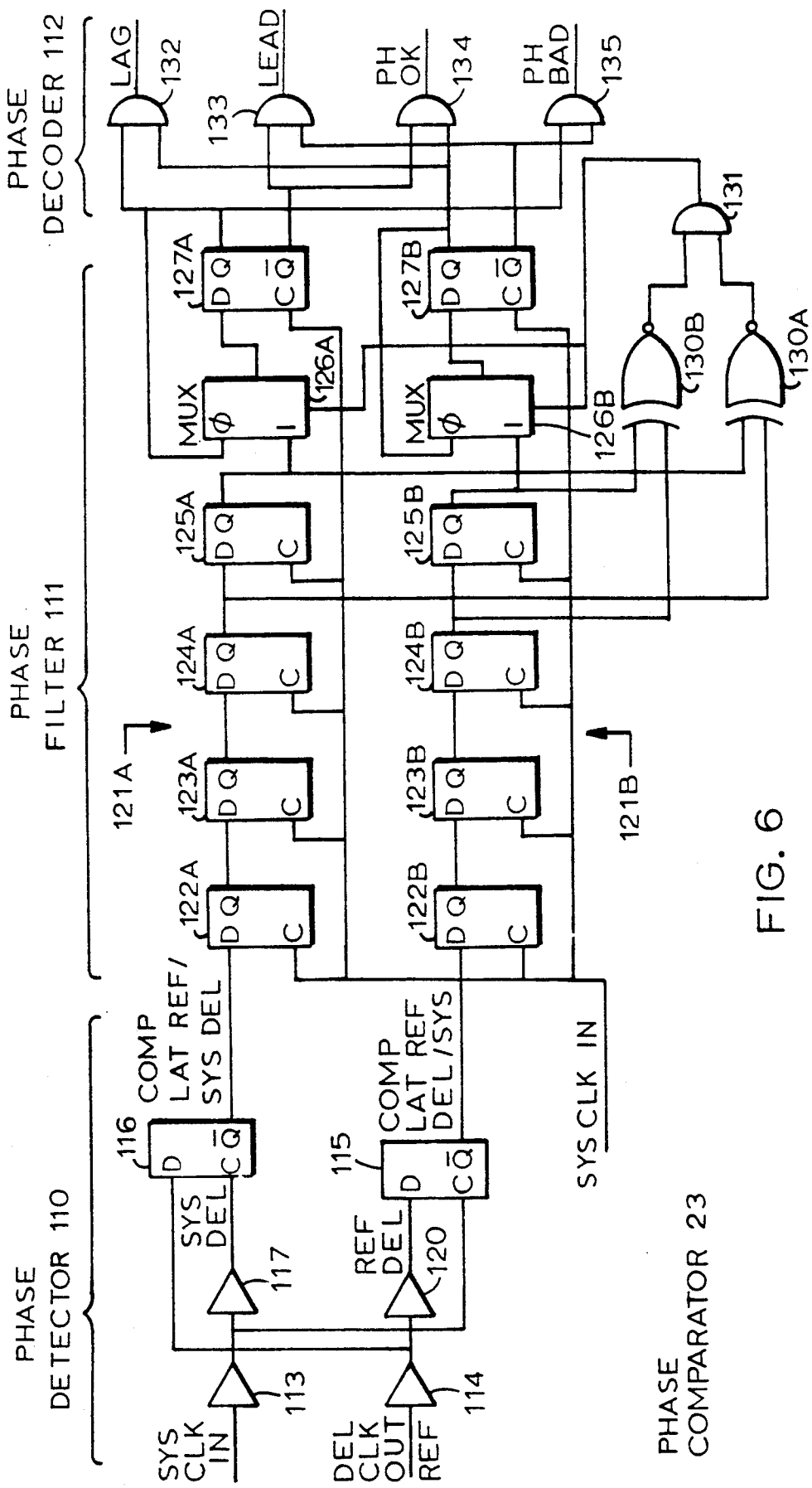
FIG. 6 is a logic diagram of a phase comparator useful in the clock buffer circuit depicted in FIG. 1.

FIG. 6 depicts a logic diagram of a circuit for phase comparator 23 (FIG. 1) useful in the clock buffer circuit 10. A similar circuit may be used for the phase comparators 32A and 32B in the variable delay element 20. With reference to FIG. 6, the phase comparator 23 includes three major elements, including a phase detector 110, a phase filter 111 and a phase decoder 112. The phase detector 110 receives the SYS CLK IN system clock in signal and the DEL CLK OUT REF delayed clock out reference signal from the driver 16 (FIG. 1) and generates in response thereto a COMP LAT REF/SYS-DEL complement latched reference/system-delayed signal and a COMP LAT REF-DEL/SYS complement latched reference-delayed/system signal. The phase filter 111 receives these signals, delays and filters them, and generates complementary output signals for each of the received signals. The phase decoder 112 receives the complementary output signals and generates the LAG, LEAD, PH OK in-phase, and PH BAD out-of-phase signals for transmission to the delay control circuit 22.

The phase detector 110 asserts and negates the COMP LAT REF/SYS-DEL complement latched reference/system-delayed signal and a COMP LAT REF-DEL/SYS complement latched reference-delayed/system signal in response to selected phase relationships between the SYS CLK IN system clock in and DEL CLK OUT REF delayed clock out reference signals. In particular, the phase detector 110 includes two buffers 113 and 114 that receive the SYS CLK IN system clock in and DEL CLK OUT REF delayed clock out reference signals, respectively. Each buffer 113 and 114 couples its respective input signal to an input terminal of a flip-flop 115 and 116, respectively, and to an input terminal of a delay element 117 and 120, respectively.

Delay element 117 receives a signal from buffer 113 and in response generates a SYS DEL system delayed signal, which is similar to the SYS CLK IN system clock in signal, but with edges delayed by an amount determined by buffer 113 and delay element 117. Similarly, delay element 120 receives a signal from buffer 114 and in response generates a REF DEL reference delayed signal, which is similar to the DEL CLK OUT REF delayed clock out reference signal, but delayed by an amount determined by buffer 113 and delay element 120. Buffers 113 and 114 may provide similar delay periods, which may thus be ignored in the following discussion of operation of phase detector 110, but delay element 117 provides a longer delay period than delay element 120.

Flip-flops 115 and 116 essentially compare the timings of the edges of the REF DEL reference delayed and DEL CLK OUT REF delayed clock out reference signals to the timing of the edges of the SYS CLK IN system clock in and SYS DEL system delayed signals, respectively. The delay defined by delay element 117 defines a window in time following a leading edge of the SYS CLK IN system clock in signal such that, if either the DEL CLK OUT REF delayed clock out reference signal or the REF DEL reference delayed signal falls within the window, the phase comparator 23 asserts the PH OK in-phase signal, indicating that the signals are in phase.

More specifically, the flip-flop 116 receives at its data input terminal the DEL CLK OUT REF delayed clock out reference signal and is clocked by the SYS DEL system delayed signal from delay element 117. If the DEL CLK OUT REF delayed clock out reference signal is asserted at the leading edge of the SYS DEL system delayed signal, which will be the case if the DEL CLK OUT REF delayed clock out reference signal is either in-phase with or leads the SYS CLK IN system clock in signal, the flip-flop 116 is set, thereby negating the COMP LAT REF/SYS-DEL complement latched reference/system-delayed signal. However, if the DEL CLK OUT REF delayed clock out reference signal is negated at the leading edge of the SYS DEL system delayed signal, which will be the case if the DEL CLK OUT REF delayed clock out reference signal either lags or is out of phase with the SYS CLK IN system clock in signal, the flip-flop 116 is cleared, thereby asserting the COMP LAT REF/SYS-DEL complement latched reference/system-delayed signal.

Similarly, the flip-flop 115 receives at its data input terminal the REF DEL reference delayed signal from the delay element 120 and is clocked by the SYS CLK IN system clock in signal. If the REF DEL reference delayed signal is negated at the leading edge of the SYS CLK IN system clock in signal from buffer 113, which will be the case if the DEL CLK OUT REF delayed clock out reference signal is either in phase with or lags the SYS CLK IN system clock in signal, the flip-flop 115 is cleared, thereby asserting the COMP LAT REF-DEL/SYS complement latched reference-delayed/system signal. On the other hand, if the REF DEL reference delayed signal is asserted at the leading edge of the SYS CLK IN system clock in signal, which will be the case if the DEL CLK OUT REF delayed clock out reference signal either leads or is out of phase with the SYS CLK IN system clock in signal, the flip-flop 115 is set, thereby negating the COMP LAT REF-DEL/SYS complement latched reference-delayed/system signal.

The phase filter 111 includes two filter paths 121A and 121B which delay and filter the received COMP LAT REF/SYS-DEL complement latched reference/system-delayed and COMP LAT REF-DEL/SYS complement latched reference-delayed/system signals, respectively, and which generate filtered and complementary signals in response thereto. The filter paths 121A and 121B are generally similar to each other, and so only filter path 121A will be described. Filter path 121A includes flip-flops 122A through 125A and 127A, a multiplexer 126A, and an exclusive-OR gate 130A. In addition, the phase filter 111 includes an AND gate 131, controlled by exclusive-OR gate 130A and the corresponding exclusive-OR gate 130B of filter path 121B, which control both multiplexers 126A and 126B in unison. The filter paths 121A and 121B are structured and operate in a manner similar to buffer section 72 (FIG. 4) of the selector 31, and will not be described further.

The flip-flop 127A of filter path 121A transmits, from its Q and Q-bar output terminals, respectively, the true and complement of the COMP LAT REF/SYS-DEL complement latched reference/system-delayed signal, as delayed and filtered by filter path 121A. Similarly, the flip-flop 127B of filter path 121B transmits, from its Q and Q-bar output terminals respectively, the true and complement of the COMP LAT REF-DEL/SYS complement latched reference-delayed/system signal as delayed and filtered by filter path 121B. All of the signals from the flip-flops 127A and 127B are coupled to the phase decoder 112. Phase decoder 112 comprises a series of AND gates 132 through 135 that generate the LAG, LEAD, PH OK in-phase, and PH BAD out-of-phase signals, respectively.

AND gate 132 receives the signals from the Q output terminals of both flip-flops 127A and 127B, which, in turn, correspond to the true of both the COMP LAT REF/SYS-DEL complement latched reference/system-delayed signal and the COMP LAT REF-DEL/SYS complement latched reference-delayed/system signal. As noted above, if (i) the true of the COMP LAT REF/SYS-DEL complement latched reference/system-delayed signal is asserted, indicating that the DEL CLK OUT REF delayed clock out reference signal either lags or is out of phase with the SYS CLK IN system clock in signal, and (ii) the true of the COMP LAT REF-DEL/SYS complement latched reference-delayed/system signal is asserted, indicating that the DEL CLK OUT REF delayed clock out reference signal is either in phase with or lags the SYS CLK IN system clock in signal. The coincidence of these conditions, which is indicated by generation by AND gate 132 of an asserted LAG signal, occurs if the DEL CLK OUT REF delayed clock out reference signal lags the SYS CLK IN system clock in signal.

AND gate 133 receives the signals from the Q-bar output terminals of both flip-flops 127A and 127B, which, in turn, correspond to the complement of both the COMP LAT REF/SYS-DEL complement latched reference/system-delayed signal and the COMP LAT REF-DEL/SYS complement latched reference-delayed/system signal. As noted above, if (i) the complement of the COMP LAT REF/SYS-DEL complement latched reference/system-delayed signal is asserted (the true of the signal is negated), indicating that the DEL CLK OUT REF delayed clock out reference signal either leads or is in phase with the SYS CLK IN system clock in signal, and (ii) the complement of the COMP LAT REF-DEL/SYS complement latched reference-delayed/system signal is asserted (the true of the signal is negated), indicating that the DEL CLK OUT REF delayed clock out reference signal is either out-of-phase with or leads the SYS CLK IN system clock in signal. The coincidence of these conditions, which is indicated by generation by AND gate 133 of an asserted LEAD signal, occurs if the DEL CLK OUT REF delayed clock out reference signal leads the SYS CLK IN system clock in signal.

AND gate 134 receives one signal from the Q-bar output terminal of flip-flop 127A, which corresponds to the complement of the COMP LAT REF/SYS-DEL complement latched reference/system-delayed signal, and a second signal from the Q output terminal of flip-flop 127B, which corresponds to the true of the COMP LAT REF-DEL/SYS complement latched reference-delayed/system signal. As noted above, if (i) the complement of the COMP LAT REF/SYS-DEL complement latched reference/system-delayed signal is asserted (the true of the signal is negated), indicating that the DEL CLK OUT REF delayed clock out reference signal either leads or is in phase with the SYS CLK IN system clock in signal, and (ii) the true of the COMP LAT REF-DEL/SYS complement latched reference-delayed/system signal is asserted, indicating that the DEL CLK OUT REF delayed clock out reference signal is either in-phase with or lags the SYS CLK IN system clock in signal. The coincidence of these conditions, which is indicated by generation by AND gate 133 of an asserted PH OK in-phase signal, occurs if the DEL CLK OUT REF delayed clock out reference signal is in phase with the SYS CLK IN system clock in signal.

Finally, AND gate 135 receives a signal from the Q output terminal of flip-flop 127A, which corresponds to the true of the COMP LAT REF/SYS-DEL complement latched reference/system-delayed signal, and a second signal from the Q-bar output terminal of flip-flop 127B, which corresponds to the complement of the COMP LAT REF-DEL/SYS complement latched reference-delayed/system signal. As noted above, if (i) the true of the COMP LAT REF/SYS-DEL complement latched reference/system-delayed signal is asserted, indicating that the DEL CLK OUT REF delayed clock out reference signal either lags or is out-of-phase with the SYS CLK IN system clock in signal, and (ii) the complement of the COMP LAT REF-DEL/SYS complement latched reference-delayed/system signal is asserted (the true of the signal is negated), indicating that the DEL CLK OUT REF delayed clock out reference signal is either out-of-phase with or leads the SYS CLK IN system clock in signal. The coincidence of these conditions, which is indicated by generation by AND gate 133 of an asserted LEAD signal, occurs if the DEL CLK OUT REF delayed clock out reference signal is out of phase with the SYS CLK IN system clock in signal.

Accordingly, the phase comparator 23 generates the four signals LAG, LEAD, PH OK in-phase and PH BAD out-of-phase signals used by the delay control circuit 22 as described above.

The clock buffer circuit 10 described above in connection with FIGS. 1 through 6 can provide several advantages. As noted above, the circuit 10 can control the timing of edges of the DEL CLK OUT REF delayed clock output reference signal, and thus corresponding edges of the DEL CLK OUT delayed clock output signals, in relation to corresponding edges the SYS CLK IN system clock in signal, obviating problems that may result from timing differences among chips which may result from tolerances and variations in manufacturing processes. This can reduce manufacturing costs that might normally be imposed by tight manufacturing tolerances or that might be required to screen chips after manufacture. Alternatively, the buffer circuit 10 can enable a corresponding increase in processing, since variations in the timings of the DEL CLK OUT delayed clock output signals among the various chips comprising a system can be controlled or reduced.

It will be appreciated that numerous variations can be made in the clock buffer circuit 10 as described above, with the attainment of some or all of the advantages noted above. For example, the variable delay element 20 described in connection with FIGS. 2 and 3, includes phase comparators 32A and 32B that directly measure the phase relationships between the A DEL CLK and B DEL CLK delayed clock signals from the A and B delay paths 25A and 25B. This may be useful if, for example, there may be differences in the delays provided by the A and B delay paths 25A and 25B for the same binary-encoded values of the respective AC(8:0) and BC(8:0) counter signals. If the delays are effectively the same, the phase comparators 32A and 32B may be eliminated, with the phase differences being reflected in the difference between the binary-encoded values of the AC(8:0) and BC(8:0) counter signals.

In addition, the variable delay element 20 may be implemented with a single delay path 25, instead of two delay paths 25A and 25B (FIG. 2). In that case, the variable delay element 20 may merely include a single delay line, such as the shared delay line 30 and A delay line 26A (FIGS. 3A and 3B), in which case the phase comparators 32A and 32B and selector 31 would not be necessary. In that case, the delay clock signal (corresponding to the A DEL CLK signal) may have some noise as a result of changes in the conditions of the multiplexers corresponding to multiplexers 42A through 42D in the delay line. In some applications, the amount of noise may not be a problem with the controlled circuitry, or the buffer 11 and clock network 15 may have sufficient capacitance that the noise does not reach the controlled circuitry. Alternatively, the variable delay element may include circuitry for detecting when the A DEL CLK delay clock signal is negated, and change the conditions of the multiplexers controlling the delay line only then, thereby avoiding generation of noise.

Furthermore, if the amount of delay through the buffer 11 is reasonably predictable, it may be possible to add an additional delay element in the clock signal path either at the input terminal at which the variable delay element 20 receives the SYS CLK IN system clock in signal or at the output terminal at which it transmits the COMP DEL CLK composite delay clock signal. For example, if the SYS CLK IN system clock in signal has a fifty-percent duty cycle, and if the desired delay is one hundred and eighty degrees, an inverter may be provided at the input terminal to the variable delay element 20 provide the desired delay. As noted above, preferably the delay provided by the various delay paths 25A and 25B of the variable delay element 20 will be several times the period of the SYS CLK IN system clock in signal. However, this may unduly constrain the low-frequency range of the SYS CLK IN system clock in signal which the clock buffer circuit 10 may accommodate. Accordingly, the additional delay element may, if the amount of delay through buffer 11 is otherwise reasonably predictable, permit this constraint to be relaxed, extending the low-frequency range that can be accommodated.

Reference numerals are being provided in the following claims solely to aid in the identification of elements disclosed in this specification which support the respective claim elements, and not be taken as limiting the scope of the respective claims.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A clock buffer control circuit for connection to a clock buffer, the clock buffer generating a clock buffer output signal (DEL CLK OUT) in response to an intermediate clock signal (COMP DEL CLK), said clock buffer control circuit comprising:
   A. a variable delay element (20) which receives a system clock signal (SYS CLK IN) and generates said intermediate clock signal having a delay that is controlled in response to a delay control signal, said variable delay element including:
      i. first and second controllable variable delay lines (26A or 26B and 30) which receives the system clock signal and generates said intermediate clock signal in response to a delay line control signal; and
      ii. a delay line control circuit (27A, 27B) for generating said delay line control signal in response to said delay control signal;
   B. a phase comparator (23) for generating phase comparison signals in response to phase differences between said clock buffer output signal and said system clock signal; and
   C. a delay control circuit (22) for generating said delay control signal in response to said phase comparison signals to thereby control the delay provided by said variable delay element to provide a selected timing relationship between the system clock signal and the clock buffer output signal.

2. A clock buffer control circuit as defined in claim 1 in which each of said first and second controllable variable delay lines comprises:
   A. a plurality of serially-connected delay elements (40(i) (j)) including a first delay element for receiving said system clock signal; and
   B. a multiplexer circuit (42A–42D) having data input terminals for receiving signals from selected ones of said delay elements, an output terminal for transmitting said intermediate clock signal, and a control terminal for receiving said delay line control signal, the multiplexer circuit selectively coupling a signal from one of its data input terminals to its output terminal in response to said delay line control signal to thereby provide a selected delay.

3. A clock buffer control circuit as defined in claim 2 in which said delay line control circuit comprises a binary counter (27A, 27B) for generating an output signal, said delay line control signal comprising the output signal of said binary counter, the binary counter operating in response to directional count enabling signals from said delay control circuit.

4. A clock buffer control circuit as defined in claim 1 in which each of said first and second controllable variable delay line comprises a plurality of ranks (41) connected in series, one of said ranks being a first rank, each of said ranks comprising:
   A. a plurality of delay elements (40(i)(j)) connected in series, one of said delay elements in each rank being a first delay element in its respective rank, said first delay element of said first rank receiving said system clock signal; and B. a multiplexer circuit (42A-42D) having data input terminals for receiving signals from terminals of selected ones of said delay elements in its rank, an output terminal for transmitting a clock signal to the first delay element of the succeeding rank, and a control terminal for receiving said delay line control signals, the multiplexer circuit selectively coupling a signal from one of its data input terminals to its output terminal in response to the delay line control signal to thereby provide a selected delay for the rank.

5. A clock buffer control circuit as defined in claim 4 in which each delay element in a rank provides a delay which is less than the delay provided by a delay element of a preceding rank in said series.

6. A clock buffer control circuit as defined in claim 5 in which each delay element in a rank provides approximately the same amount of delay as all of the delay elements of all successive ranks of the series.

7. A clock buffer control circuit as defined in claim 4 in which said delay line control circuit comprises a binary counter (27A, 27B) providing an output signal, said delay line control signal comprising the output signal of said binary counter, the binary counter operating in response to directional count enabling signals from said delay control circuit.

8. A clock buffer control circuit for connection to a clock buffer, the clock buffer generating a clock buffer output signal (DEL CLK OUT) in response to an intermediate clock signal (COMP DEL CLK), said clock buffer control circuit comprising:
   A. a variable delay element (20) which receives a system clock signal (SYS CLK IN) and generates said intermediate clock signal having a delay that is controlled in response to a delay control signal, said variable delay element including:
      i. first and second controllable variable delay lines (26A or 26B and 30) which receive the system clock signal and generate first and second delayed clock signals in response to a first and second delay line control signals;
      ii. first and second delay line control circuits (27A, 27B) for generating said first and second delay line control signals in response to a delay control signal; and
      iii. a selector circuit (31) for selectively coupling one of said first and second delayed clock signals as said intermediate clock signal in response to a selection signal;
   B. a phase comparator (23) for generating phase comparison signals in response to phase differences between said clock buffer output signal and said system clock signal; and
   C. a delay control circuit (22) for generating said delay control signal and said selection signal in response to said phase comparison signals to thereby control the delay provided by said variable delay element to provide a selected timing relationship between the system clock signal and the clock buffer output signal.

9. A clock buffer control circuit as defined in claim 8 in which each of said first and second controllable variable delay lines comprises:
   A. a plurality of serially-connected delay elements (40(i) (j)) including a first delay element for receiving said system clock signal; and
   B. a multiplexer circuit (42A-42D) having data input terminals for receiving signals from terminals of selected ones of said delay elements, an output terminal for transmitting said respective first and second delayed clock signals, and a control terminal for receiving said delay line control signal, the multiplexer circuit selectively coupling a signal from one of said data input terminals to its output terminal in response to the delay line control signal to thereby provide a selected delay.

10. A clock buffer control circuit as defined in claim 9 in which each delay line control circuit comprises a binary counter (27A, 27B) for generating an output signal, the delay line control signal comprising the output signal of the respective binary counter, the binary counters operating in response to first and second directional count enabling signals from said delay control circuit.

11. A clock buffer control circuit as defined in claim 8 in which each of said first and second controllable variable delay lines comprises a plurality of ranks (41) connected in series, one of said ranks being a first rank, each of said ranks comprising:
   A. a plurality of delay elements (40(i)(j)) connected in series, one of said delay elements being a first delay element in its respective rank, said first delay element of said first rank receiving said system clock signal; and
   B. a multiplexer circuit (42A-42D) having data input terminals for receiving signals from terminals of selected ones of said delay elements in its rank, an output terminal for transmitting a clock signal to the first delay element of the succeeding rank, and a control terminal for receiving said delay line control signals, the multiplexer circuit selectively coupling a signal from one of its data input terminals to its output terminal in response to the delay line control signal to thereby provide a selected delay for the rank.

12. A clock buffer control circuit as defined in claim 11 in which each delay element in a rank provides a delay which is less than the delay provided by a delay element of a preceding rank in said series.

13. A clock buffer control circuit as defined in claim 12 in which each delay element in a rank provides approximately the same amount of delay as all of the delay elements of all successive ranks of the series.

14. A clock buffer control circuit as defined in claim 11 in which said delay line control circuit comprises a binary counter (27A, 27B) providing an output signal, said delay line control signal comprising the output signal of said binary counter, the binary counter operating in response to directional count enabling signals from said delay control circuit.

15. A clock buffer control circuit as defined in claim 8 in which said variable delay element further includes a phase comparison circuit (32A, 32B) which generates a delayed clock phase relationship signal indicating a phase relationship between said first and second delayed clock signals, said delay control circuit (22) generating said selection signal in response to said delayed clock phase relationship signal.

16. A clock buffer control circuit as defined in claim 15 in which said phase comparison circuit includes first and second delayed clock phase comparators (32A, 32B) each for generating phase relationship signals in response to a comparison between the phase of one of said first and second delayed clock signals and the other of said first and second delayed clock signals.

17. A clock buffer control circuit as defined in claim 8 in which said selector includes:
   A. a multiplexer (70) for receiving said first and second delayed clock signals at respective data input terminals and for selectively coupling one of them to its data output terminal as said intermediate clock signal in response to a selection control signal at a control terminal;
   B. a control circuit (72, 73) for generating said selection control signal in response to said selection signal from said delay control circuit and said first and second delayed clock signals.

18. A clock buffer control circuit as defined in claim 17 in which said control circuit comprises:
   A. a filter circuit (72) for receiving said selection signal from said delay control circuit and for generating a filtered selection signal in response thereto;
   B. a selection control circuit (73) including:
      i. a comparator (86, 90) for generating a selection comparison signal in response to the condition of the filtered selection signal and the selection control signal;
      ii. a phase detection circuit (85) for generating a phase relation signal in response to a selected phase relationship between the first and second delayed clock signals; and
      iii. a selection control signal generating circuit (83, 84) for generating said selection control signal in response to said selection comparison signal and said phase relation signal.

19. A clock buffer control circuit as defined in claim 1 in which said phase comparator (23) comprises:
   A. a phase detector (110) for generating phase identification signals in response to selected phase relationships between said clock buffer output signal and said system clock signal; and
   B. a decoder (112) for receiving said phase identification signals and for generating said phase comparison signals in response thereto.

20. A clock buffer control circuit as defined in claim 19 in which said phase comparator further includes a filter (111) which receives said phase identification signals and generates filtered phase identification signals in response thereto, said decoder receiving said filtered phase identification signals and generating the phase comparison signals in response thereto.

21. A clock buffer control circuit as defined in claim 19 in which said phase detector comprises:
   A. a system clock delay circuit (117) for generating a delayed system clock signal, the system clock signal and the delayed system clock signal defining a time window; and
   B. a reference comparison circuit (115, 116 120) that generates the phase comparison signal in response to a selected relationship between the clock buffer output signal and the time window.

22. A clock buffer control circuit as defined in claim 18 in which said filter (72) comprises:
   A. a delay circuit (74, 75, 76) for receiving said selection and generating in response a delayed selection signal;
   B. a comparison circuit (80) for receiving said selection signal and said delayed selection signal and for generating a selection control signal having a change condition if conditions of said selection signal and said delayed selection signal differ and a hold condition if the conditions are the same; and
   C. a selection circuit (81, 82) connected to said delay circuit and said comparison circuit for generating the filtered selection signal, said selection circuit selectively coupling (i) the delayed selection signal as the filtered selection signal in response to the selection control signal having the change condition or (ii) maintaining the filtered selection signal in response to the selection control signal having the hold condition.

23. A clock buffer control circuit as defined in claim 20 in which said filter includes a plurality of filter paths each for filtering one of said phase identification signals, each filter path comprising:
   A. a delay circuit (122A-125A, 122B-125B) for receiving one of said phase identification signals and generating in response a delayed phase identification signal;
   B. a comparison circuit (130A, 130B, 131) for receiving said phase identification signal and said delayed phase identification signal and for generating a selection control signal having (i) a change condition if conditions of said phase identification signal and said delayed phase identification signal differ and (ii) a hold condition if conditions of said phase identification signal and said delayed phase identification signal are the same; and
   C. a selection circuit (126A-127A, 126B, 127B) connected to said delay circuit and said comparison circuit for generating the filtered phase identification signal, said selection circuit selectively coupling (i) the delayed phase selection signal as the filtered selection signal in response to the selection control signal having the change condition or (ii) maintaining the filtered phase selection signal in response to the selection control signal having the hold condition.

24. A clock buffer control circuit for connection to a clock buffer, the clock buffer generating a clock buffer output signal (DEL CLK OUT) in response to an intermediate clock signal (COMP DEL CLK), said clock buffer control circuit comprising:
   A. a variable delay element (20) which receives a system clock signal (SYS CLK IN) and generates said intermediate clock signal having a delay that is controlled in response to first and second directional count enabling signals, said variable delay element including:
      i. first and second controllable variable delay lines (26A or 26B and 30) which receive the system clock signal and generate first and second delayed clock signals in response to first and second delay line control signals, each of said first and second controllable variable delay lines including:
         (a) a plurality of delay elements (40(i)(j)) connected in series, one of said delay elements comprising a first delay element which receives said system clock signal;
         (b) a multiplexer circuit (42A-42D) having data input terminals for receiving signals from terminals of selected ones of said delay elements, an output terminal for transmitting said intermediate clock signal, and a control terminal for receiving said delay line control signals, the multiplexer circuit selectively coupling a signal from one of said data input terminals to its output terminal in response to the delay cline control signals to thereby provide a selected delay; and (c) a phase comparison circuit (32A, 32B) which generates a delayed clock phase relationship signal indicating a phase relationship between said first and second delayed clock signals;

ii. first and second delay line control circuit (27A, 27B) for generating said first and second delay line control signals, each delay line control circuit comprising a binary counter, the delay line control signals comprising the output of the respective binary counter, the binary counters operating in response to first and second directional count enabling signals;

iii. a selector circuit (31) for selectively coupling one of said first and second delayed clock signals as said intermediate clock signal in response to a selection signal from said delay control circuit; and B. a phase comparator (23) for generating phase comparison signals in response to phase differences between said clock buffer output signal and said system clock signal; and C. a delay control circuit (22) comprising a state machine circuit element (FIG. 5) which operates in a plurality of successive states, each state being determined by previous states, the phase comparison signals and the delayed clock phase relationship signals, said state machine circuit element selectively generating said first and second directional count enabling signals and said selection signal in each state to provide a selected timing relationship between the system clock signal and the clock buffer output signal.

25. A signal conditioning circuit comprising:

A. controllable first and second variable signal conditioning circuits (26A or 26B and 30) which receive an input signal and generate, in response thereto and in response to a respective first and second conditioning control signals, respective first and second conditioned signals, each of said first and second variable conditioning circuits generating said first and second conditioned signals by varying a selected signal characteristic by an amount determined by said respective first and second conditioning control signals;

B. a selector circuit (31) for selectively coupling one of said first and second conditioned signals as an output signal in response to a selection signal;

C. a condition comparator (23) for generating signal condition comparison signals in response to differences of a selected signal characteristic between said output signal and input signal; and D. a composite condition control circuit (22) for generating said first and second conditioning control signals and said selection signal in response to said signal condition comparison signals to thereby control the conditioning of said selected signal characteristic provided by first and second variable signal conditioning circuits to thereby provide a selected relationship between the selected signal characteristic of said input signal and the selected signal characteristic of said output signal.

26. A signal conditioning circuit as defined in claim 25 in which each of said first and second variable signal conditioning circuits comprises:

A. a plurality of conditioning elements connected in series, said series including a first conditioning element for receiving said input signal and each of said other conditioning elements receiving a signal from another of said conditioning elements in said series; and B. a multiplexer circuit having data input terminals for receiving signals from terminals of selected ones of said conditioning elements, an output terminal for transmitting said respective first or second conditioned signal, and a control terminal for receiving said first and second conditioning control signals, the multiplexer circuit selectively coupling a signal from one of said data input terminals to its output terminal in response to the composite conditioning control signals to thereby provide a selected conditioning of said selected signal characteristic.

27. A signal conditioning circuit as defined in claim 25 in which said composite condition control circuit comprises a binary counter (27A, 27B) for generating an output signal, the first and second conditioning control signals comprising the output signal of the respective binary counter, the binary counters varying their respective output signals in response to respective first and second directional count enabling signals from said condition comparator.

28. A signal conditioning circuit as defined in claim 25 in which each of said first and second variable signal conditioning circuits comprises a plurality of ranks connected in series, one of said ranks being a first rank, each of said ranks comprising:

A. a plurality of conditioning elements connected in series, each series including a first conditioning element in its respective rank, said first conditioning element of said first rank receiving said input signal, each of said other first conditioning elements receiving a signal from another of said ranks in said series and each of said other conditioning elements in each rank receiving a signal from another of said conditioning elements in the respective rank; and B. a multiplexer circuit having data input terminals for receiving signals from terminals of selected ones of said conditioning elements in its rank, an output terminal for transmitting a signal to the first conditioning element of the succeeding rank, and a control terminal for receiving said first and second conditioning control signals, the multiplexer circuit selectively coupling a signal from one of its data input terminals to its output terminal in response to the first and second conditioning control signals to thereby provide a selected conditioning for the rank.

29. A signal conditioning circuit as defined in claim 28 in which each conditioning element in a rank provides an amount of conditioning which is less than the amount of conditioning provided by a conditioning element of a preceding rank in said series.

30. A signal conditioning circuit as defined in claim 29 in which said each conditioning element in a rank provides approximately the same amount of conditioning as all of the conditioning elements of all successive ranks of the series.

31. A signal conditioning circuit as defined in claim 28 in which said composite condition control circuit comprises a binary counter (27A, 27B) providing an output signal, said first and second conditioning control signals comprising the output signal of said binary counter, the binaryy counter varying their output signals in response to respective directional count enabling signals from said condition comparator.

32. A signal conditioning circuit as defined in claim 25 in which said selector includes:
A. a multiplexer (70) for receiving said first and second conditioned signals at respective data input terminals and for selectively coupling one of them to its data output terminal as said output signal in response to a selection control signal at a control terminal;
B. A selector control circuit (72, 73) for generating said selection control signal in response to said selection signal from said composite condition control circuit and said first and second conditioned signals.

33. A signal conditioning circuit as defined in claim 32 in which said selector control circuit comprises:
A. a filter circuit (72) for receiving said selection signal from said composite condition control circuit and for generating a filtered selection signal in response thereto;
B. a selection control circuit (73) including:
 i. a comparator (86, 90) for generating a selection comparison signal in response to the condition of the filtered selection signal and the selection control signal;
 ii. a characteristic detection circuit (85) for generating a characteristic relation signal in response to a relationship between the selected signal characteristic of first and second conditioned signals; and
 iii. a selection control signal generating circuit (83, 84) for generating said selection control signal in response to said selection comparison signal and said characteristic relation signal.

34. A signal conditioning circuit as defined in claim 33 in which said filter (72) comprises:
A. a delay circuit (74, 75, 76) for receiving said selection signal and generating in response a delayed selection signal;
B. a comparison circuit (80) for receiving said selection signal and said delayed selection signal and for generating a selection control signal having (i) a change condition if conditions of said selection signal and said delayed selection signal differ and (ii) a hold condition if conditions of said selection signal and said delayed selection signal are the same; and
C. a selection circuit (81, 82) connected to said delay circuit and said comparison circuit for generating the filtered selection signal, said selection circuit selectively coupling (i) the delayed selection signal as the filtered selection signal in response to the selection control signal having the change condition or (ii) maintaining the filtered selection signal in response to the selection control signal having the hold condition.

35. A clock buffer control circuit for connection to a clock buffer, the clock buffer generating a clock buffer output signal (DEL CLK OUT) in response to an intermediate clock signal (COMP DEL CLK), said clock buffer control circuit comprising:
A. first and second controllable variable delay lines (26A or 26B and 30) which receive the system clock signal and generate, in response thereto and in response to respective first and second delay line control signals, first and second delayed clock signals whose phases are delayed with respect to the system clock signal by an amount determined by said respective first and second delay line control signals;
B. a selector circuit (31) for selectively coupling one of said first and second delayed clock signals as said intermediate clock signal in response to a selection signal;
C. a phase comparator (23) for generating phase comparison signals in response to phase differences between said clock buffer output signal and said system clock signal; and
D. a delay control circuit (22) for generating said first and second delay line control signals and said selection signal in response to said phase comparison signals to thereby control the delay provided by said first and second controllable variable delay lines to provide a selected timing relationship between the system clock signal and the clock buffer output signal.

* * * * *